United States Patent [19]
Sim et al.

[11] Patent Number: 5,399,518
[45] Date of Patent: Mar. 21, 1995

[54] METHOD FOR MANUFACTURING A MULTIPLE WALLED CAPACITOR OF A SEMICONDUCTOR DEVICE

[75] Inventors: Sang-pil Sim; Joo-young Yun, both of Kyungki-do; Chang-kyu Hwang, Seoul; Jeong-gil Lee, Kyungki-do; Chul-ho Shin, Seoul; Won-woo Lee, Kyungki-do, all of Rep. of Korea

[73] Assignee: Samsung Electronics Co., Ltd., Suwon, Rep. of Korea

[21] Appl. No.: 91,369

[22] Filed: Jul. 15, 1993

[30] Foreign Application Priority Data

Jul. 15, 1992 [KR] Rep. of Korea ............... 92-12648

[51] Int. Cl.⁶ .................. H01L 21/70; H01L 27/00
[52] U.S. Cl. .................................. 437/52; 437/60; 437/919
[58] Field of Search ............... 437/47, 52, 60, 919

[56] References Cited

U.S. PATENT DOCUMENTS

| | | | |
|---|---|---|---|
| 5,061,650 | 10/1991 | Dennison et al. | 437/47 |
| 5,084,405 | 1/1992 | Fazan et al. | 437/52 |
| 5,158,905 | 10/1992 | Ahn | 437/52 |
| 5,192,702 | 3/1993 | Tseng | 437/52 |
| 5,266,512 | 11/1993 | Kirsch | 437/52 |

Primary Examiner—Olik Chaudhuri
Assistant Examiner—H. Jey Tsai
Attorney, Agent, or Firm—Charles R. Donohoe; Robert A. Westerlund, Jr.; Stephen R. Whitt

[57] ABSTRACT

A method for manufacturing a double-cylindrical storage electrode of a capacitor of a semiconductor memory device, utilizes an outer etching mask for forming an outer cylinder and an inner etching mask for forming an inner cylinder. After forming a conductive structure on a semiconductor substrate, an outer etching mask for forming an outer cylinder and an inner etching mask for forming an inner cylinder are formed on the conductive structure. Then, the conductive structure is anisotropically etched using the outer and inner etching masks, thereby forming a double-cylindrical first electrode. Since a double-cylindrical storage electrode can be obtained from a single conductive layer, the influence of native oxidation circumvented. In addition, the double-cylindrical storage electrode of the capacitor according to the present invention decreases the risk of structural fragmenting because the electrode is obtained from one material layer, instead of a combination of layers as is conventionally-known. Also, the storage electrode of the present invention has no sharp edges, so that leakage current can be minimized or avoided.

4 Claims, 18 Drawing Sheets

METHOD FOR MANUFACTURING A MULTIPLE WALLED CAPACITOR OF A SEMICONDUCTOR DEVICE

BACKGROUND OF THE INVENTION

The present invention relates to a method for manufacturing a capacitor of a semiconductor memory device, and more particularly to a method for manufacturing a capacitor of a highly integrated semiconductor memory having a double-cylindrical storage electrode for high reliability and large cell capacitance for memory cells.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of a memory cell as well as consumes excessive power during low-voltage operation by impeding device operation.

Generally, in a 64 Mb DRAM having a 1.5 $\mu m^2$ memory cell area employing an ordinary two-dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example, double-stacked, fin-structured, cylindrical, spread-stacked and box-structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, wherein pillars or another inner cylinder is formed in the interior of the cylinder. Not only may both inner and outer surfaces of the cylinder be utilized as the effective capacitor area, but also the outer surface of the pillars or the inner cylinder formed in the interior of the cylinder.

For example, T. Kaga et al. have suggested a crown-shaped stacked capacitor (see "Crown-Shaped Stacked-Capacitor Cell for 1.5 V Operation 64-Mb DRAM's" by T. Kaga et al., IEEE Transactions on Electron Devices Vol. 38 No. 2, February 1991, pp 255-260), wherein an inner cylinder is formed in the interior of the cylinder (outer cylinder); which is hereinafter referred to as a double-cylindrical capacitor.

FIGS. 1 to 4 are sectional views for illustrating a conventional manufacturing method of the double-cylindrical stacked capacitor of a semiconductor memory device, as described in the above T. Kaga et al. paper.

FIG. 1 illustrates a step of forming a first polycrystalline silicon layer 34 for forming an outer cylinder, and a spacer 36. Particularly, transistors which commonly share a bit-line 20 and a drain region 16, and which comprises a source region 14 and a gate electrode 18, respectively, are formed on an active region of a semiconductor substrate which is divided into active and isolation regions by a field oxide layer 12. An insulating layer 19 is then formed on the whole surface of the resultant structure to insulate the transistors from other conductive layers (which will be formed in the subsequent step). Thereafter, a planarization layer 22 is formed on the over insulating layer. A contact hole is then formed for connecting a storage electrode with source region 14 by partially removing planarization layer 22 and insulating layer 19 formed on source region 14. Then, a pillar electrode 30 filling the contact hole is formed by sequentially depositing a first polycrystalline silicon and first silicon dioxide layer 24, followed by a silicon nitride layer 26 and second silicon dioxide layer 32 on the surface of the insulating layer 19. Thereafter, a well is formed by partially removing second silicon dioxide layer 32, silicon nitride layer 26 and first silicon dioxide layer 24 formed over source region 14. The well is formed so that it defines individual cell units and exposes the surface of pillar electrode 30. Then, first polycrystalline silicon layer 34 for forming the outer cylinder is formed on the whole surface of the resultant structure. Then, a third silicon dioxide layer is formed on first polycrystalline silicon layer 34. The third silicon dioxide layer is anisotropically etched, thereby forming a spacer 36 on the inner sidewall of the well.

FIG. 2 illustrates a step of forming a second polycrystalline silicon layer 38 and a fourth silicon dioxide layer 40. After the steps illustrated in FIG. 1, a second polycrystalline silicon layer 38 for forming an outer cylinder is formed by depositing a third polycrystalline silicon layer on the whole surface of the resultant structure on which spacer 36 has been formed. A fourth silicon dioxide layer 40 is then formed on the whole surface of the resultant so as not to expose second polycrystalline silicon layer 38.

FIG. 3 illustrates a steps of forming a storage electrode 100. After the step of FIG. 2, fourth silicon dioxide layer 40 is etched back. The etch-back is performed on the whole surface of the resultant until a portion of second polycrystalline silicon layer 38 is exposed. Here, reference numeral 40' denotes an oxide residue formed in inner cylinder which has resulted from the etching back of fourth silicon dioxide layer 40. Then, the exposed part of second polycrystalline silicon layer 38 is anisotropically etched to thereby expose a portion of first polycrystalline silicon layer 34, which is also removed by anisotropically etching, thereby forming a storage electrode 100 comprised of outer cylinder 34' and inner cylinder 38'.

FIG. 4 illustrates a step of completing a capacitor. After removing oxide residue 40', spacer 36 and second silicon dioxide layer 32, a dielectric layer 110 is formed on the whole surface of storage electrode 100. Then, a plate electrode 120 is formed by depositing a fourth polycrystalline silicon material on the whole surface of the resultant structure, thereby completing a capacitor comprised of storage electrode 100, dielectric film 110, and plate electrode 120.

According to the above conventional method for manufacturing a capacitor of a semiconductor memory device, a double cylinder-type storage electrode having an inner cylinder inside an outer cylinder can be manufactured, thereby enlarging the cell capacitance of a semiconductor memory device. However, this method has certain drawbacks.

First, as shown in FIG. 1, after the contact hole for the formation of the pillar electrode is formed, the hole is covered with the first polycrystalline silicon layer 34. The precise covering of the contact hole with the first polycrystalline silicon layer 34 is crucial because the shape of the outer cylinder formed over the contact hole depends on the state in which the first polycrystalline silicon layer 34 covers the contact hole. This process is very difficult to satisfactorily achieve.

Second, as shown in FIG. 1, when forming the well by anisotropically etching second silicon dioxide layer 32, the well is apt to be formed so as to have a sloped sidewall, which causes voids between cells when subsequently forming the plate electrode. Thus, the electrical characteristics of the memory device are potentially deteriorated.

Thirdly, as shown in FIG. 3, etching-back fourth silicon dioxide layer 40 is difficult to control, so uniform cell capacitance cannot be easily realized.

Fourth, as shown in FIG. 2, since the storage electrode is a combination of three polycrystalline silicon layers, a native oxide layer may form on the inter-surfaces of the polycrystalline silicon layers. This leads to an increase in the series electrical resistance and a decrease in the interlayer adherence so that fragments of the polycrystalline silicon layer may be lost when force is applied thereto, for example, when spinning the wafer.

Fifth, since the conventional double-cylindrical electrode described above has sharply edged ends, (e.g., at the ends of the inner and outer cylinders) there is a high probability that a leakage current is created.

SUMMARY OF THE INVENTION

Therefore, the object of the present invention is to provide a novel method for manufacturing a double-cylindrical capacitor of a semiconductor memory device, which guarantees high reliability and large cell capacitance of the memory device.

To accomplish the aforementioned object, the present invention provides a method of manufacturing a capacitor of a semiconductor memory device, which is characterized in that after forming an etching mask for forming an outer cylinder (hereinafter referred to as an "outer etching mask") and an etching mask for forming an inner cylinder (hereinafter referred to as an "inner etching mask") on a conductive layer or pattern, the conductive layer or pattern is etched using the outer and inner etching masks.

Briefly, the present invention provides a method for manufacturing a capacitor of a semiconductor memory device, which comprises the steps of: forming a conductive structure on a semiconductor substrate; forming an outer etching mask for forming an outer cylinder on the conductive structure and an inner etching mask for forming an inner cylinder on the conductive structure; anisotropically etching the conductive structure using the outer and inner etching masks, thereby forming a double-cylindrical first electrode; removing the outer and inner etching masks; forming a dielectric film covering the first electrode; and forming a second electrode on the dielectric film. The conductive structure may be a conductive pattern which is defined into individual cell units or a conductive layer pattern having a groove outside the outer etching mask. Also, the conductive pattern may have a upwardly-stepped portion near the edge thereof.

The outer etching mask is a spacer formed on an outer sidewall of the upwardly stepped portion and the inner etching mask is a spacer formed on an inner sidewall of the upwardly stepped portion.

According to one aspect of the present invention, the outer and inner etching masks can be formed by forming a conductive layer on a semiconductor substrate; forming a first material layer pattern which is defined into an individual cell unit on the conductive layer; forming a first spacer on a sidewall of the first material layer pattern; forming a second spacer on a sidewall of the first spacer; anisotropically etching the conductive layer using the first material layer pattern and the first and second spacers as etch masks, thereby forming a first conductive pattern defined into an individual cell unit; removing the first material layer pattern and the second spacer; anisotropically and partially etching the first conductive pattern using the first spacer as an etching mask, thereby forming a second conductive pattern having an upwardly stepped portion; forming an inner spacer on the inner sidewall of the upwardly stepped portion and outer spacer on the outer sidewall of the upwardly stepped portion; and removing the first spacer.

According to another aspect of the present invention, the outer and inner etching masks can be formed by forming a conductive layer on the semiconductor substrate; forming on the conductive layer a first material layer pattern which is defined into an individual cell unit; forming a first spacer on a sidewall of the first material layer pattern; forming a second spacer on a sidewall of the first spacer; anisotropically etching the conductive layer using the first material layer pattern and the first and second spacers as etch masks, thereby forming a first conductive pattern defined into an individual cell unit; removing the first material layer pattern and the second spacer; forming an inner spacer on the inner sidewall of the first spacer and outer spacer on the outer sidewall of the first spacer and then removing the first spacer.

According to still another aspect of the present invention, a conductive layer pattern having a groove between adjacent portions of the conductive layer pattern and the outer and inner etching masks are formed by forming a conductive layer on a semiconductor substrate; forming a first material layer on the conductive layer; forming a composite pattern comprised of a second material layer pattern and a third material layer pattern, which is defined into an individual cell unit; forming a first spacer on a sidewall of the composite pattern; anisotropically etching the first material layer using the first spacer and the third material layer pattern as an etching mask to thereby form a first material layer pattern; removing the first spacer and the third material layer pattern; forming the outer etching mask on a sidewall of the first material layer pattern and an inner etching mask on a sidewall of the second material layer pattern; and simultaneously removing the second material layer pattern and forming a groove in the conductive layer to thereby provide the conductive layer pattern having a groove.

According to yet another aspect of the present invention, the conductive layer pattern having a groove and the outer and inner etching masks are formed by forming a conductive layer on the semiconductor substrate; forming a first material layer on the conductive layer; forming on the first material layer a composite pattern comprised of a second material layer pattern and a third material layer pattern, which is defined into an individual cell unit; forming a first spacer on a sidewall of the composite pattern; anisotropically etching the first material layer using the first spacer and the third material layer pattern as an etching mask to thereby form a first material layer pattern; removing the first spacer and the third material layer pattern; forming the outer etching mask on a sidewall of the first material layer pattern and an inner etching mask on a sidewall of the second material layer pattern; removing the second material layer pattern and forming a groove to thereby provide the conductive layer pattern having a groove; and anisotropically etching the first material layer pattern.

According to yet still another aspect of the present invention, the conductive layer pattern having a groove and the outer and inner etching masks are formed by forming a conductive layer on the semiconductor substrate; forming on the conductive layer a composite pattern comprised of a first material layer pattern and a second material layer pattern, which is defined into an individual cell unit; forming a third material layer covering the composite pattern and having a recessed portion; forming a first spacer on sidewalls of the recessed portion; anisotropically etching the third material layer using the first spacer as an etching mask to thereby form a third material layer pattern beneath the first spacer; removing the first spacer and the second material layer pattern; forming the outer etching mask on the outer sidewall of the third material layer pattern and an inner etching mask between the third material layer pattern and the first material layer pattern; partially etching the conductive layer using the outer and inner etching masks, the third material layer pattern and the first material layer pattern as an etching mask to thereby provide the conductive layer having a groove; and removing the first material layer pattern and the third material layer pattern.

According to the present invention, a double-cylindrical storage electrode of a capacitor can be obtained from a single conductive layer by using an outer etching mask for forming an outer cylinder and an inner etching mask for forming an inner cylinder. This circumvents the influence of a native oxide layer, provides for electrode durability, and ensures large cell capacitance by obtaining inner and outer cylinders of equal height. Also, the storage electrode of the present invention has no sharp edges, so that the leakage current therefrom can be avoided.

BRIEF DESCRIPTION OF THE DRAWINGS

The above object and other advantages of the present invention will become more apparent by describing in detail a preferred embodiment of the present invention with reference to the attached drawings in which.

DESCRIPTION OF THE PREFERRED EMBODIMENTS

The present invention will be described in more detail, hereinbelow, with reference to the attached drawings.

Embodiment 1

FIGS. 5 to 9 are sectional views for illustrating a first embodiment of a method for manufacturing a semiconductor memory device of the present invention.

Figure 1:
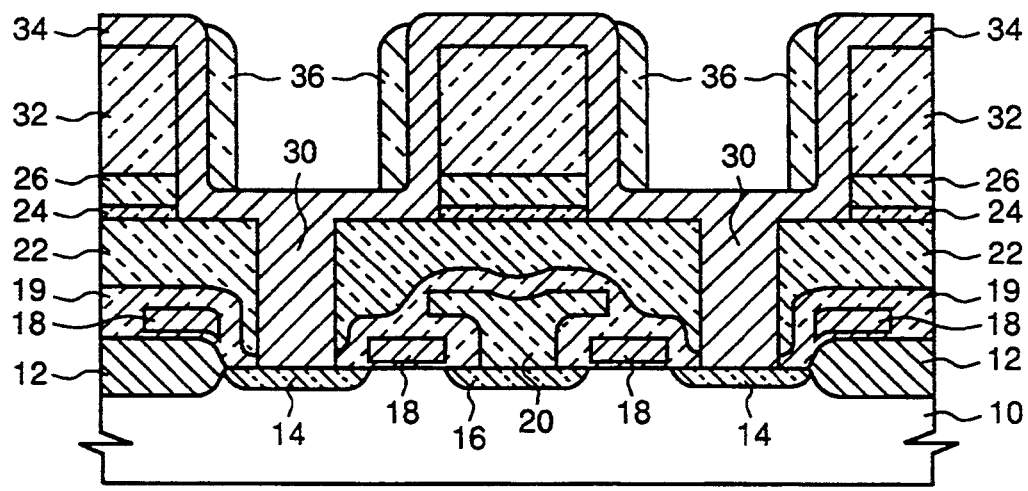
FIGS. 1 to 4 are sectional views for illustrating a conventional method for manufacturing a double-cylindrical capacitor of a semiconductor memory device.
Figure 2:
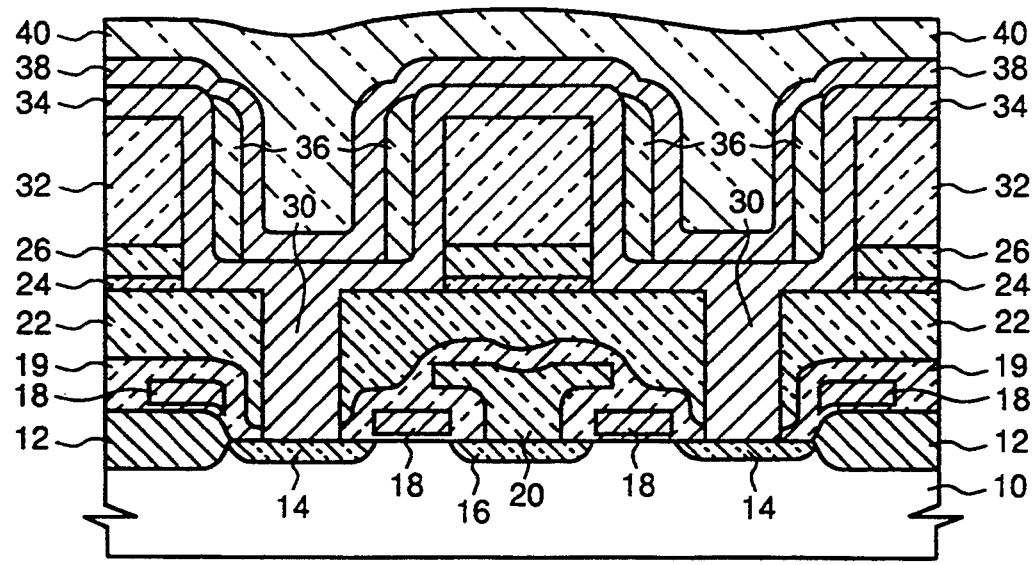
Figure 3:
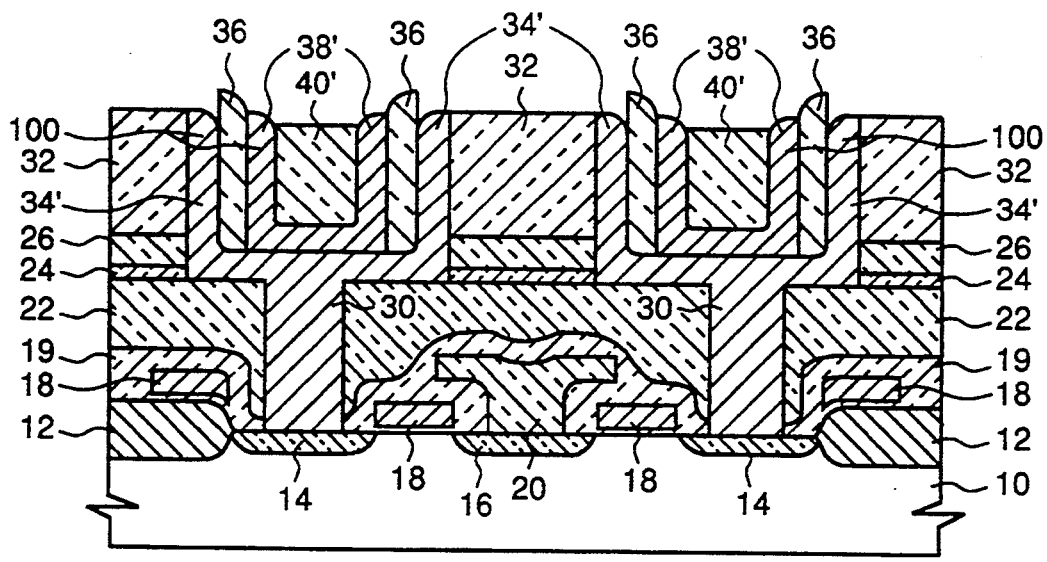
Figure 4:
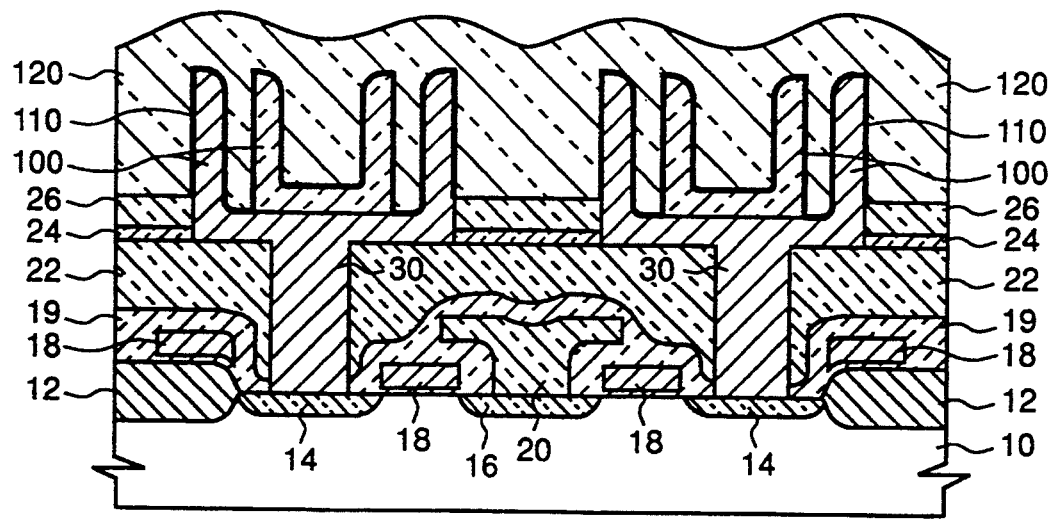
Figure 5:
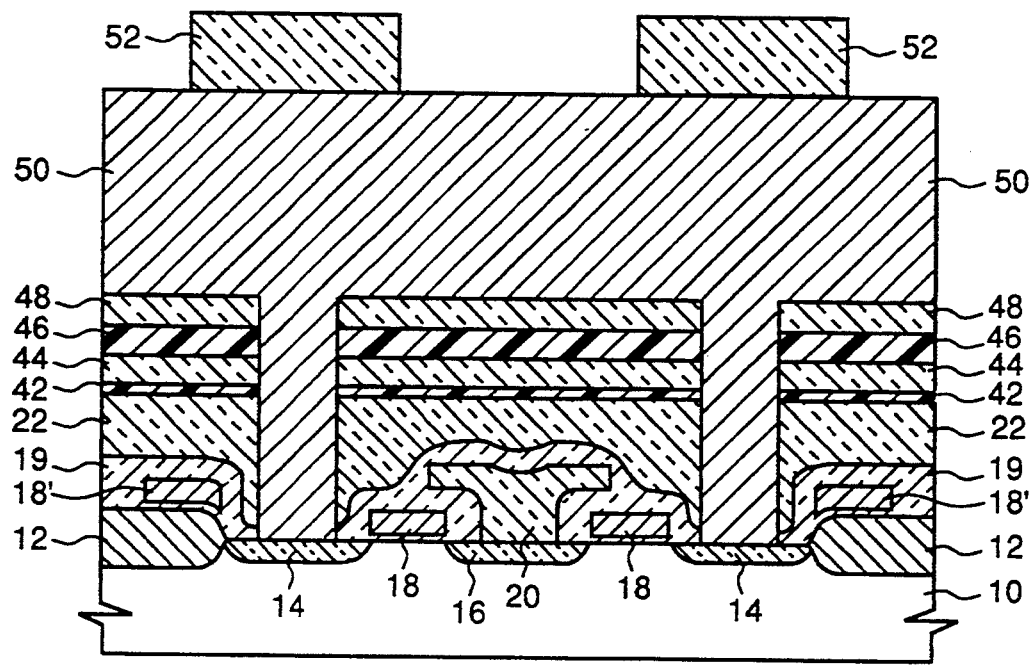
FIGS. 5 to 9 are sectional views for illustrating a first embodiment of a method for manufacturing a capacitor of a semiconductor memory device according to the present invention.

FIG. 5 illustrates a step of forming a first material pattern 52 on a first conductive layer 50. More particularly, a field oxide layer 12 is formed on semiconductor substrate 10 for defining an active region and an isolation region. Thereafter, a plurality of transistors each of which commonly shares bit-line 20 and a drain region 16 and comprises a source region 14 and a gate electrode 18, is formed on the active region. Gate electrode 18 is extended over field oxide layer 12 to thereby form a word-line 18'. Then, a pure oxide layer, e.g., a high-temperature oxide (HTO) layer is coated on the whole surface of the resultant structure so as to form an insulating layer 19 for insulating the transistors from the conductive elements (e.g., a storage electrode) which are to be formed by subsequent processes. On insulating layer 19, an insulating material, e.g., a borophosphorous silicate glass (BPSG) or phosphor silicate glass (PSG), is coated on the whole surface of the resultant structure and then planarized to form a planarization layer 22.

On planarization layer 22, two insulating materials whose etch rates are different from each other with respect to any etching, for example, an oxide such as an HTO and a nitride such as a silicon nitride ($Si_3N_4$), are deposited in turn, thereby forming an etching stop layer 42 and first, second, and third insulating interlayers 44, 46 and 48 as first, second and spacing layer. Here, etching stop layer 42 is formed by depositing a nitride such as silicon nitride to a thickness of about 100 Å–200 Å. First insulating interlayer 44 is formed by depositing an oxide such as an HTO to a thickness of about 500 Å–1,000 Å. Second insulating interlayer 46 is formed by depositing a nitride such as a silicon nitride to a thickness of about 500 Å–1,000 Å. Third insulating interlayer 48 is formed by depositing an oxide such as HTO to a thickness of about 500 Å–1,000 Å. First and third insulating interlayers 44 and 48 are formed for isolating insulating interlayer 46 from the lower structure (that is, etching stop layer 42) and the upper structure (for example, a first conductive layer which is to be formed in a subsequent step).

Next, a contact hole for connecting the storage electrode with source region 14 is formed by removing the materials deposited directly over source region 14 of a transistor. Then, a conductive material, for example, a polycrystalline silicon doped with an impurity, is deposited to a thickness of 4,000 Å–6,000 Å atop the surface of the resultant structure bearing the contact hole, to thereby form a first conductive layer 50 filling the contact hole. On first conductive layer 50, a first material, whose etching rate is different from that of the material constituting the first conductive layer with respect to any etching, is coated to a thickness of about 1,000 Å–1,500 Å so as to form a first material layer. The first material layer is patterned so as to be defined into individual cell units, thereby completing a first material pattern 52. As the first material, a silicon oxide may be preferably used.

Figure 6:
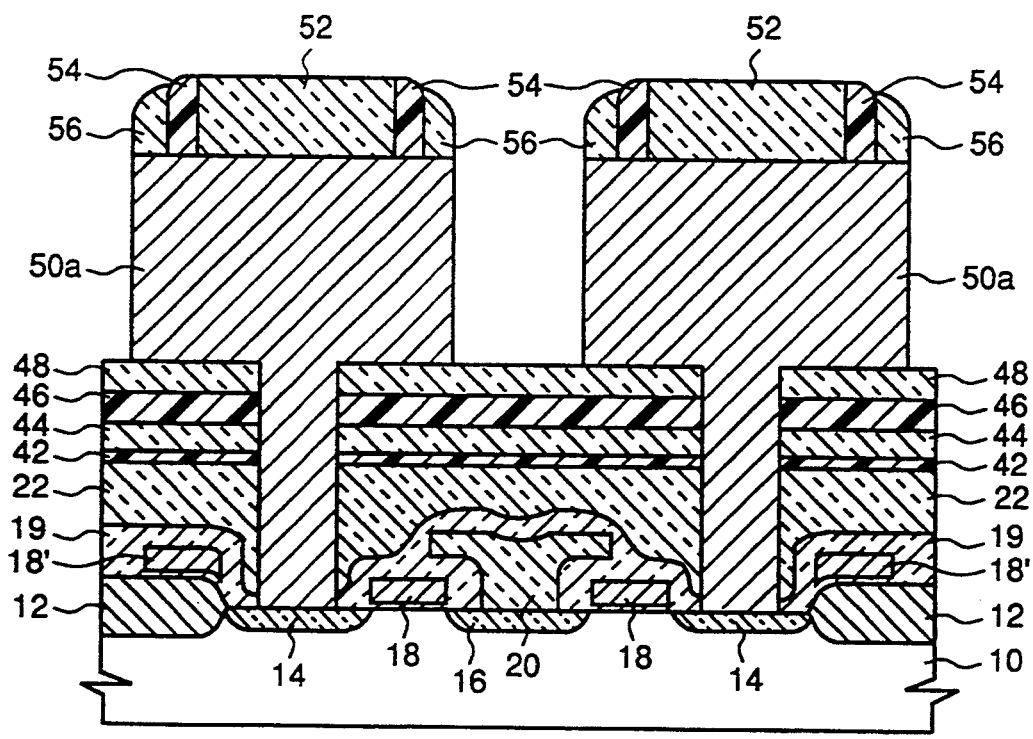

FIG. 6 illustrates a step of forming first and second spacers 54 and 56 and first conductive pattern 50a. After the step of FIG. 5, a silicon nitride is coated on the whole surface of the resultant structure having first material pattern 52 formed thereon, to thereby form a silicon nitride layer having a thickness of about 500 Å–1,000 Å. Then, the silicon nitride layer is anisotropically etched to provide first spacers 54 on the sidewalls of first material pattern 52. Thereafter, an oxide is coated to a thickness of about 500 Å–1,000 Å on the whole surface structure including first spacers 54 to thereby form an oxide layer. The oxide layer is anisotropically etched to provide second spacers 56 on the sidewalls of first spacers 54. Then, using first material pattern 52 and first and second spacers 54 and 56 as an etching mask, the exposed portion of first conductive layer 50 is anisotropically etched until the surface portion of third insulating interlayer 48 is exposed, thereby completing first conductive pattern 50a.

Figure 7:
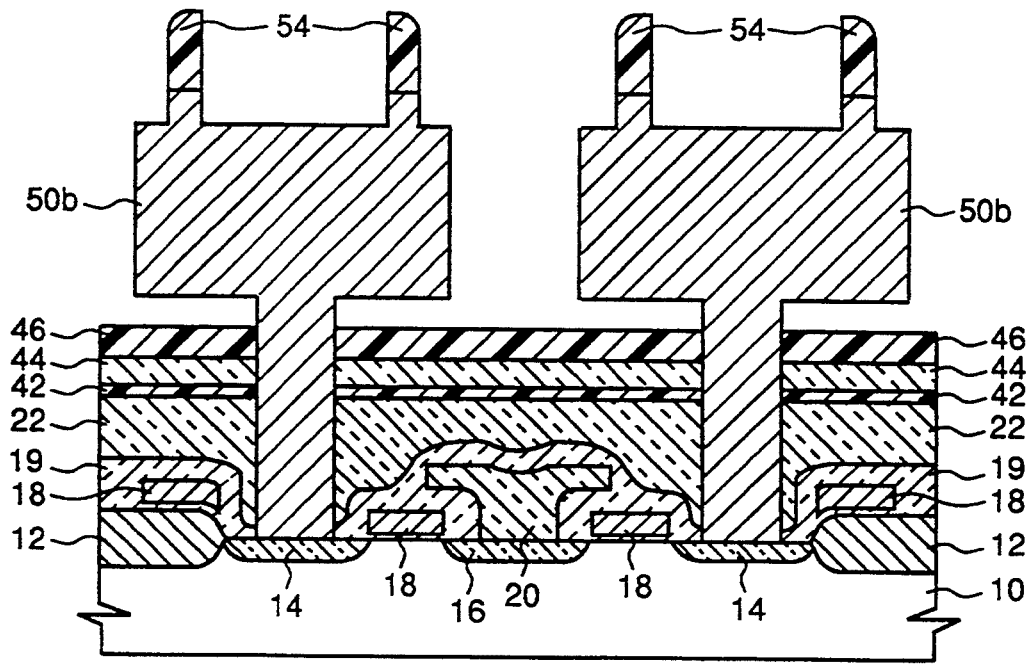

FIG. 7 illustrates a step of forming second conductive pattern 50b having an upwardly stepped portion near the edge thereof. After removing first material pattern 52 from between first spacers 54, second spacer 56, and third insulating interlayer 48, first conductive pattern 50a is etched to a predetermined depth, for example, about 500 Å, using first spacers 54 as an etching mask, thereby forming second conductive pattern 50b having an upwardly stepped portion near the edge thereof, which will be used for forming a third spacer in a subsequent step.

Figure 8:
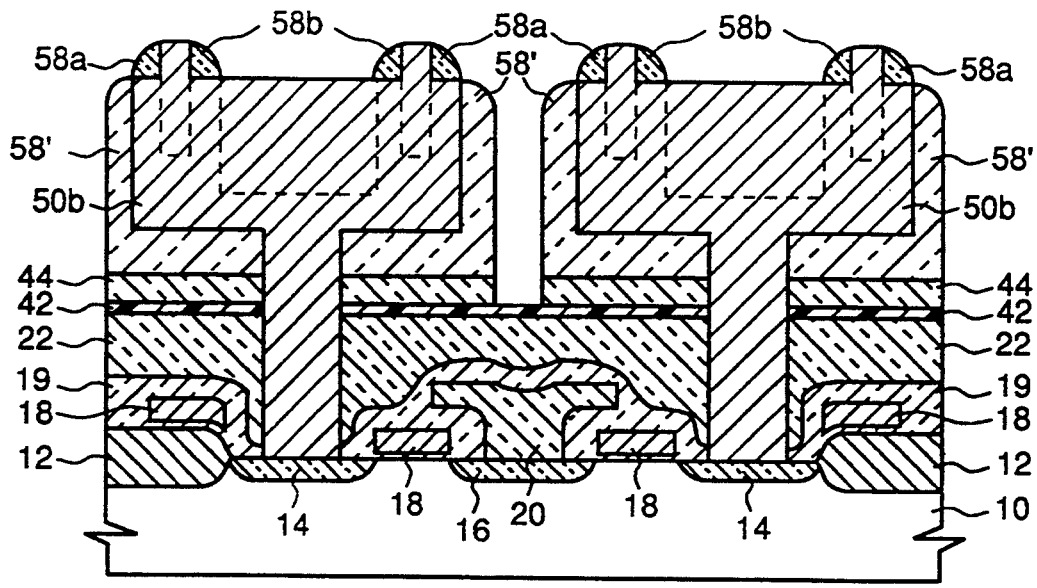

FIG. 8 illustrates a step of forming third spacers 58a and 58b for forming a double cylinder and then etching second conductive pattern 50b. After the step of FIG. 7, first spacer 54 and second insulating interlayer 46, both of which are comprised of a silicon nitride, are removed. Then, a second material whose etching rate is different from that of first conductive material 50 with respect to any etching, for example, a silicon oxide such as HTO or silicon nitride, is coated to a thickness of about 500 Å–1,000 Å on the whole surface of the resultant structure to form a second material layer. As the second material, HTO is preferably used in this embodiment. Then, the second material layer is anisotropically etched, thereby forming third spacers 58a and 58b for forming a double-cylindrical structure on the sidewall of the upwardly stepped portion of second conductive pattern 50b, and a dummy spacer 58' on the sidewall of the second conductive pattern 50b. Here, reference numerals 58a and 58b designate a third spacer for forming an outer cylinder and an inner cylinder, respectively. At this time, the first insulating interlayer 44 is partially etched so that a portion of etching stop layer 42 between adjacent second conductive patterns 50b, 50b is exposed. Thereafter, using both third spacer 58a and third spacer 58b as an etching mask, second conductive pattern 58 is anisotropically etched to a depth of about 3,000 Å–5,000 Å, thereby forming storage electrode 100. Here, the portion marked with a dotted line shows the portion removed by this etching step, and the etching depth is controlled by controlling the etching time. (This etching is referred to as "time etching.")

Figure 9:
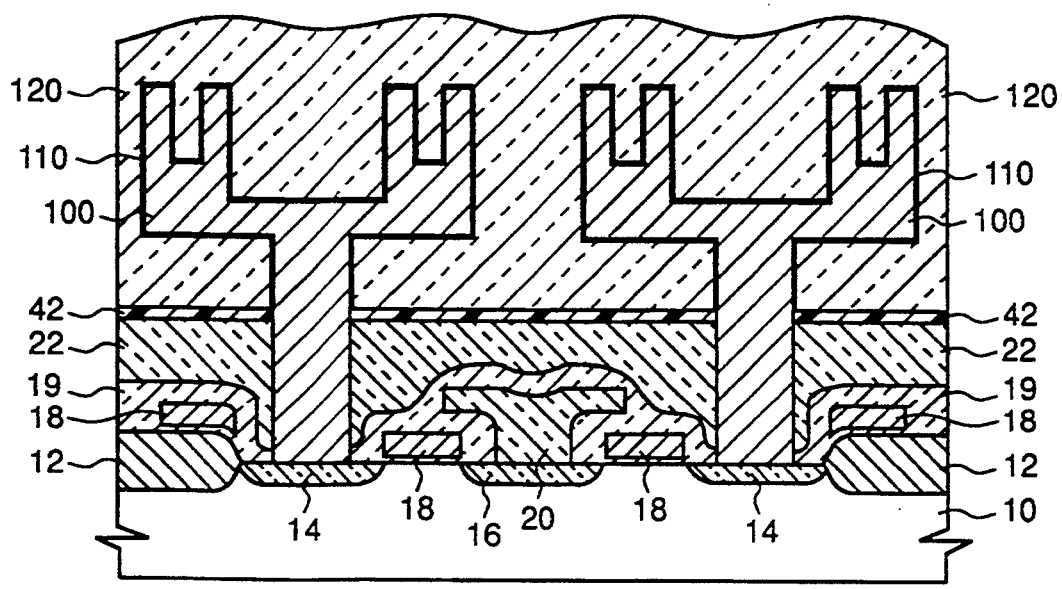

FIG. 9 illustrates the step of completing a capacitor. After the step of FIG. 8, third spacers 58a and 58b, dummy spacer 58', and first insulating interlayer 44 (all of which are comprised of a silicon oxide) are removed by wet-etching using a buffered oxide etchant (BOE) or a diluted HF solution. Then, a dielectric film 110, for example, an oxide/nitride/oxide (ONO) film, nitride/oxide (NO) film, or $Ta_2O_5$ film, is coated on the whole surface of the storage electrode 100 to a $SiO_2$-equivalent thickness of about 45 Å–60 Å. Then, a conductive material, e.g., a polycrystalline silicon doped with an impurity, is deposited on dielectric film 110, to thereby form plate electrode 120.

Embodiment 2

Figure 10:
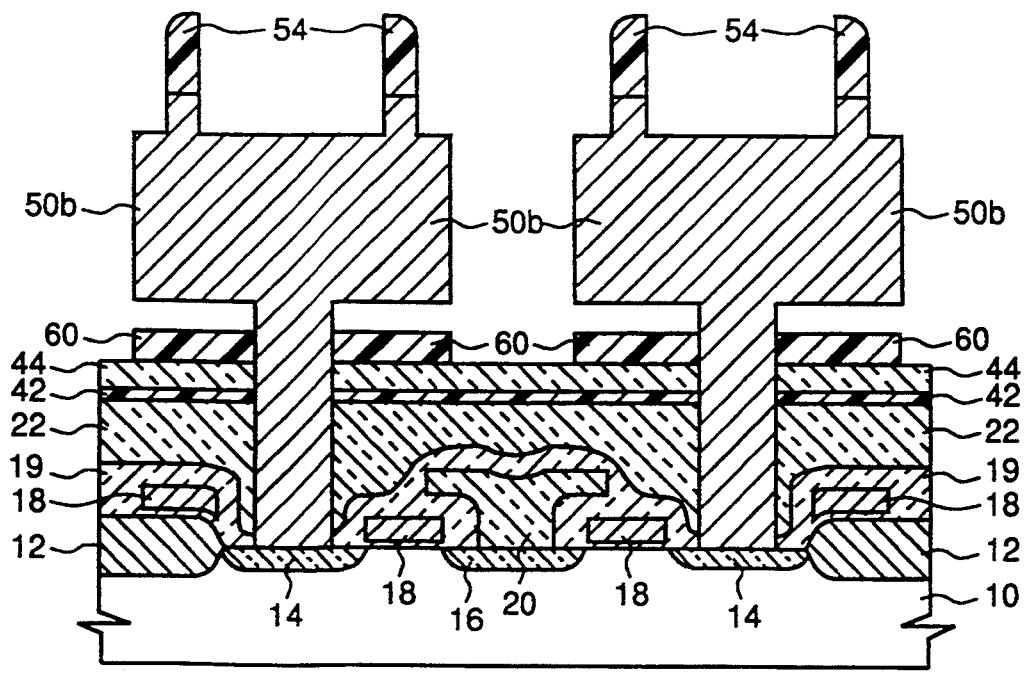
FIGS. 10 and 11 are sectional views for illustrating a second embodiment of a method for manufacturing a capacitor of a semiconductor memory device according to the present invention.
Figure 11:
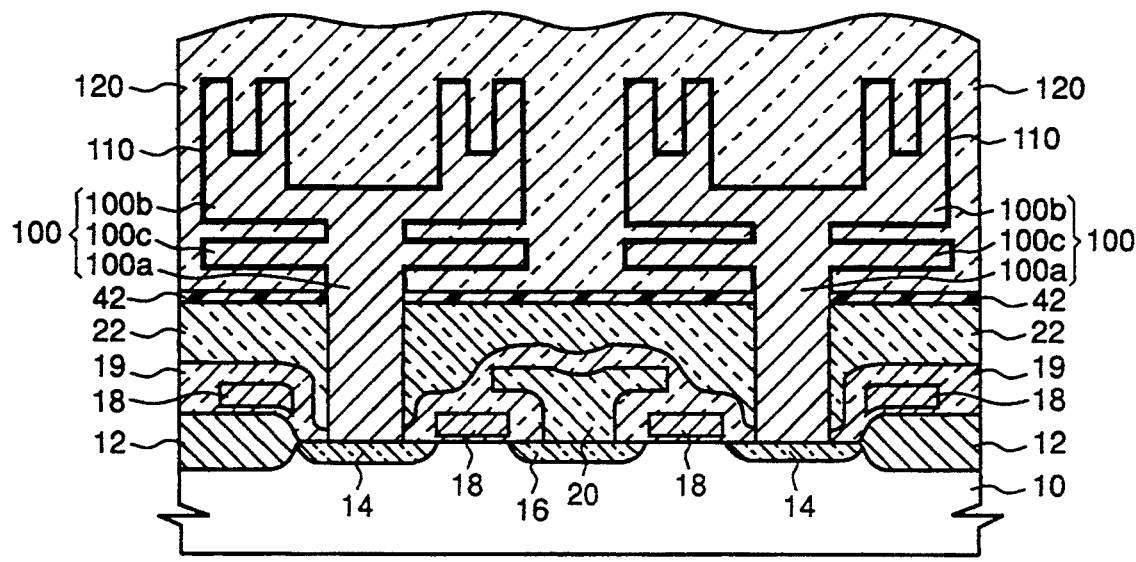

FIGS. 10 and 11 are sectional views illustrating a second embodiment of a method for manufacturing a capacitor of a semiconductor memory device according to the present invention.

This embodiment is performed in the similar manner as in Embodiment 1 except that instead of forming second insulating interlayer 46, a second conductive layer is formed as a second spacing layer on top of first insulating interlayer 44. As the material for the second conductive layer, the same material as that of first conductive layer 50 is preferably used.

FIG. 10 illustrates a step of forming second conductive pattern 50b having a upwardly stepped portion near the edge thereof. This step is performed in the same manner as described in FIG. 7 of Embodiment 1. However, when first conductive pattern 50a is anisotropically etched by using first spacers 54 as an etching mask in order to form second conductive pattern 50b, the second conductive layer is simultaneously etched, thereby forming a second conductive layer pattern 60 defined into individual cell units under second conductive pattern 50b. Second conductive layer pattern 60 becomes an auxiliary fin-structured electrode which is electrically connected to the double-cylindrical storage electrode.

FIG. 11 illustrate a step of completing a capacitor of this embodiment. After the step of FIG. 10, the steps shown in FIGS. 8 and 9 are performed in the same manner as in Embodiment 1, thereby forming a storage electrode 100 having a double-cylindrical electrode 100b having two cylinders (inner and outer), a column electrode 100a with one end connected to source region 14 of a transistor and the other connected to and thus supporting double-cylindrical electrode 100b, and a fin-structured auxiliary electrode 100c through which column electrode 100a passes at the center thereof.

Embodiment 3

FIG. 12 through 15 are sectional views illustrating a third embodiment of a method for manufacturing a capacitor of a semiconductor memory device according to the present invention.

In Embodiment 1, after first conductive pattern 50a is partially etched to form second conductive pattern 50b, third spacers 58a and 58b for forming a double-cylindrical storage electrode are formed on the sidewalls of the protruding portion of second conductive pattern 50b. In this third embodiment, spacers 62a and 62b for forming a double-cylindrical storage electrode are formed directly onto the sidewall of first spacer 54 without etching first conductive pattern 50a (as in FIG. 8).

Figure 12:
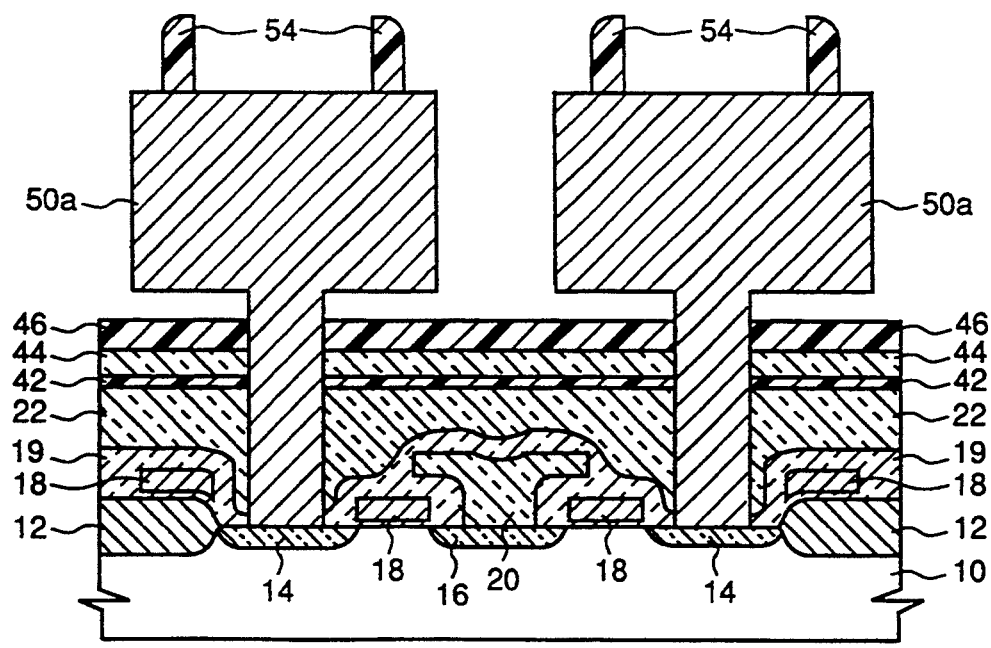
FIGS. 12 to 15 are sectional views for illustrating a third embodiment of a method for manufacturing a capacitor of a semiconductor memory device according to the present invention.

FIG. 12 illustrates a step of leaving a first spacer 54 on a first conductive pattern 50a. After performing the steps shown FIGS. 5 and 6, second spacer 56 and first material layer pattern 52, both being comprised of a silicon oxide, are removed by wet-etching using a buffered oxide etchant (BOE) or a diluted HF solution.

Figure 13:
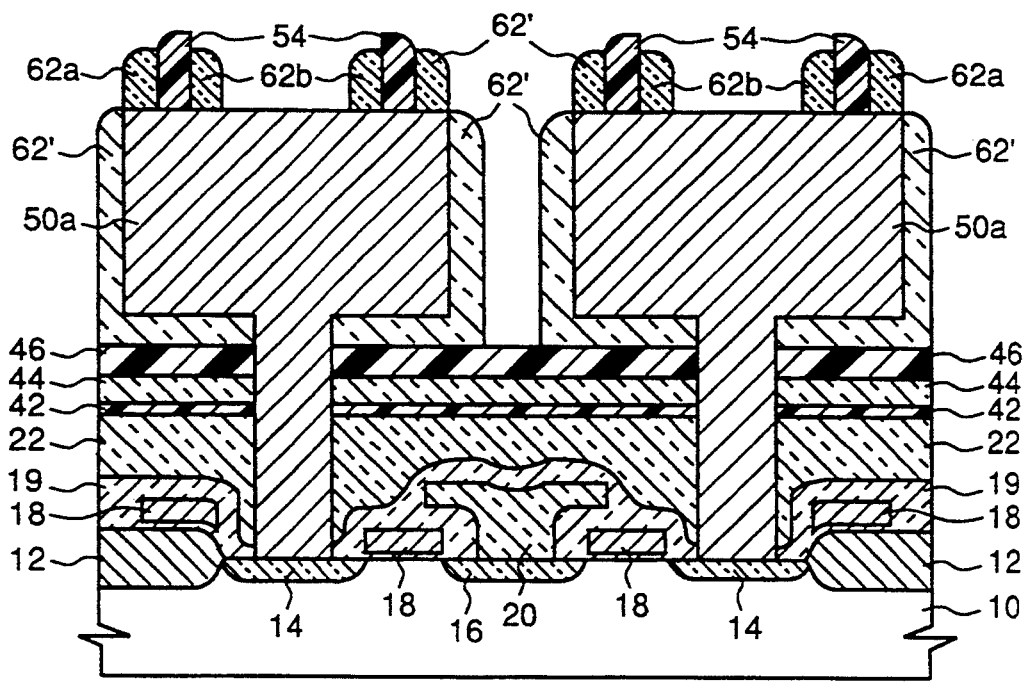

FIG. 13 illustrates a step of forming third spacers 62a and 62b. After the step of FIG. 12, on the whole surface of the resultant structure a second material whose etching rate is different from those of the materials of first spacer 54 and first conductive pattern 50a, (for example, an oxide such as an HTO), is coated to a thickness of about 500 Å–1,000 Å, thereby forming a second material layer. The second material layer is then anisotropically etched, thereby forming third spacers 62a and 62b for forming double-cylindrical storage electrode. Here, reference numerals 62a and 62b designate a third spacer for forming an outer cylinder and an inner cylinder, respectively. At this time, a dummy spacer 62' is formed on the sidewall of first conductive pattern 50a.

Figure 14:
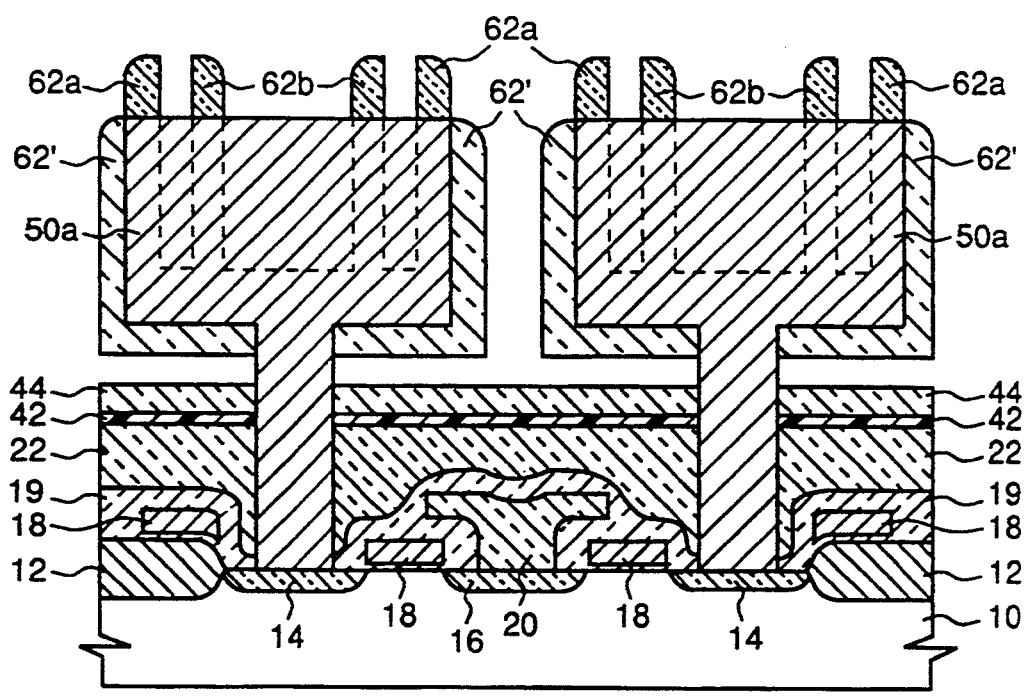

FIG. 14 illustrates the step of etching first conductive pattern 50a. After removing first spacer 54, first conductive pattern 50a is anisotropically etched to a depth of about 3,000 Å–5,000 Å, using third spacer 62a for forming an outer cylinder and third spacer 62b for forming an inner cylinder as an etching mask in the same manner as in Embodiment 1. When removing first spacer 54 comprised of a silicon nitride, second insulating layer 46 comprised of silicon nitride is also removed. Here, the portion marked with a dotted line shows the portion removed of first conductive patter 50a by this etching step.

Figure 15:
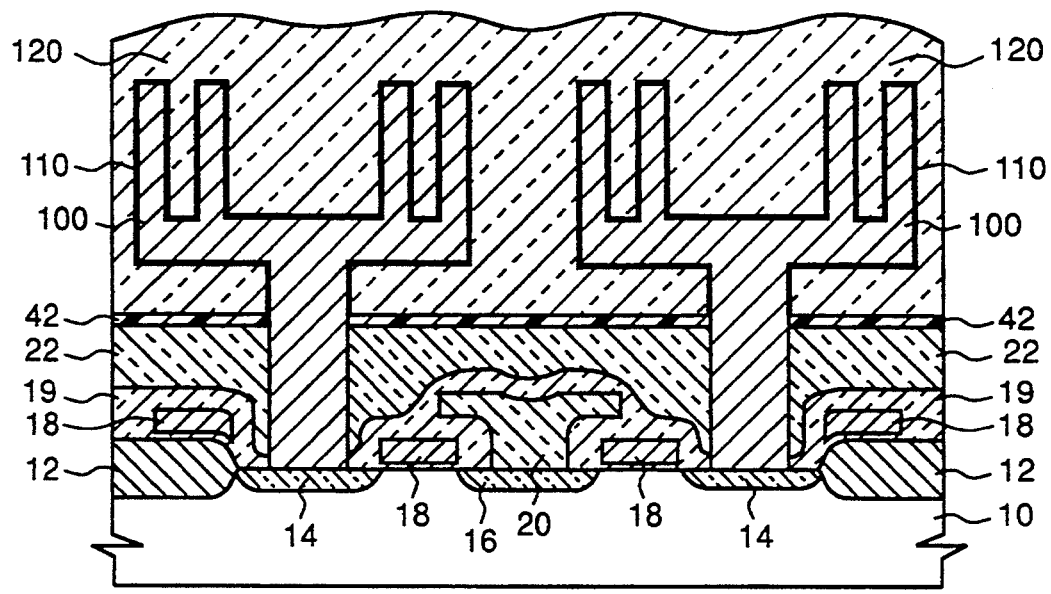

FIG. 15 illustrates the step of completing a capacitor. After the step of FIG. 14, third spacers 62a and 62b, dummy spacer 62', and first insulating interlayer 44 are removed. Then, a dielectric film 110 and a plate electrode 120 are formed in the same manner as in Embodiment 1, thereby completing a capacitor comprised of storage electrode 100, dielectric film 110 and plate electrode 120.

According to the present embodiment, the height of the storage electrode is about 500 Å–1,000 Å greater than that of the first embodiment. That is, according to the first embodiment, the first conductive pattern should be etched for forming the second conductive pattern. However, this third embodiment does not need such an etching. Therefore, a taller storage electrode with respect to the conductive layers having the same thickness, can be obtained than the first embodiment.

Additionally, it should be noted that when second insulating interlayer 46 is replaced with a second conductive layer comprised of the same material as that constituting the first conductive layer, a storage electrode having the same shape (i.e., having an auxiliary fin-structured electrode on the main double-cylindrical electrode) as shown in FIG. 11 can be obtained using this embodiment.

Embodiment 4

FIGS. 16 to 23 are sectional views illustrating a fourth embodiment of a method for manufacturing a capacitor of a semiconductor memory device according to the present invention.

Figure 16:
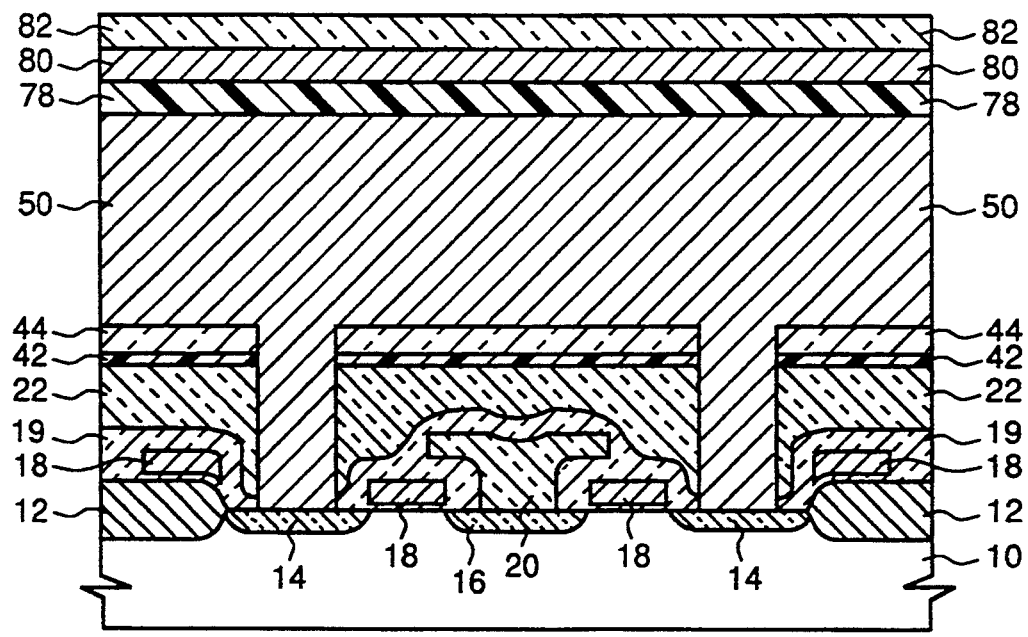
FIGS. 16 to 23 are sectional views for illustrating a fourth embodiment of a method for manufacturing a capacitor of a semiconductor memory device according to the present invention.

FIG. 16 illustrates a step of forming first conductive layer 50 and first, second and third material layers 78, 80, and 82.

More particularly, the procedure of Embodiment 1 is duplicated up to the point of forming first conductive layer 76 (See FIG. 5), except that the formation of second and third insulating interlayers 46 and 48 is omitted. Thereafter, a first material whose etch rate is different from that of the material constituting first conductive layer 76 with respect to any arbitrary etching, for example, a nitride such as a silicon nitride or an oxide such as an HTO, is coated to a thickness of about 1,000 Å on first conductive layer 76, thereby forming first material layer 78. Also, a second material having the same etching rate as that of the material constituting first conductive layer 50 with respect to any anisotropic etching, for example, a polycrystalline silicon, is coated to a thickness of about 1,000 Å on first material layer 78, thereby forming second material layer 80. Then, a third material whose etching rate is different from each of those of the materials of second and first material layers 78 and 80 and first conductive layer 76 with respect to any isotropic etching, for example, an oxide such as an HTO, or a nitride such as a silicon nitride, is coated to the thickness of about 1,000 Å on the second material layer, thereby forming third material layer 82.

Figure 17:
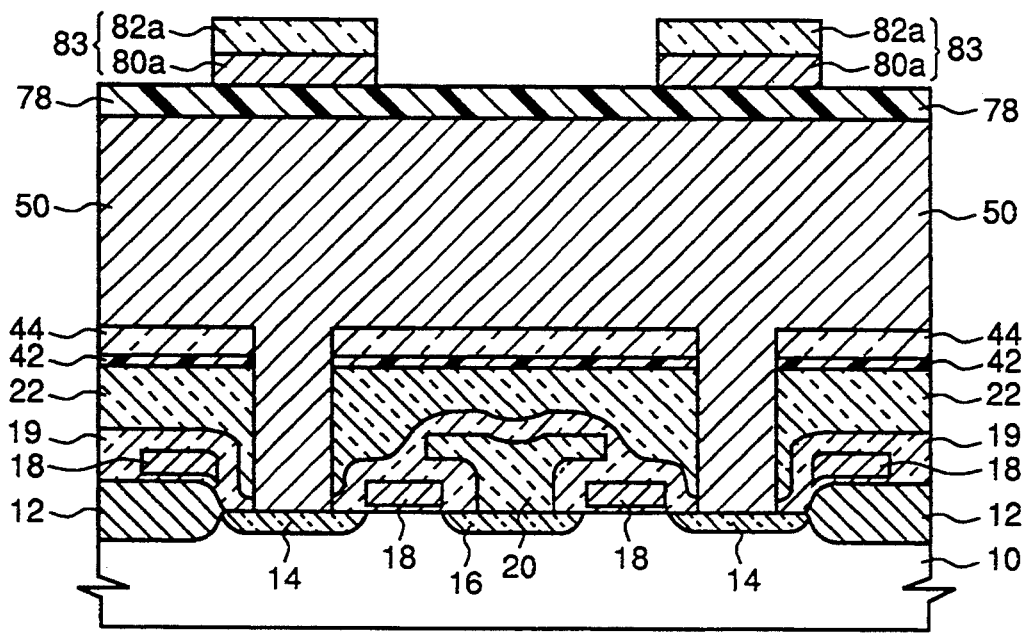

FIG. 17 illustrates a step of forming a composite pattern 83. Third and second material layers 82 and 80 are anisotropically etched via a conventional photolithography process, so that composite pattern 83 is formed which is defined into the individual cell units and is comprised of third and second material layer patterns 82a and 80a.

Figure 18:
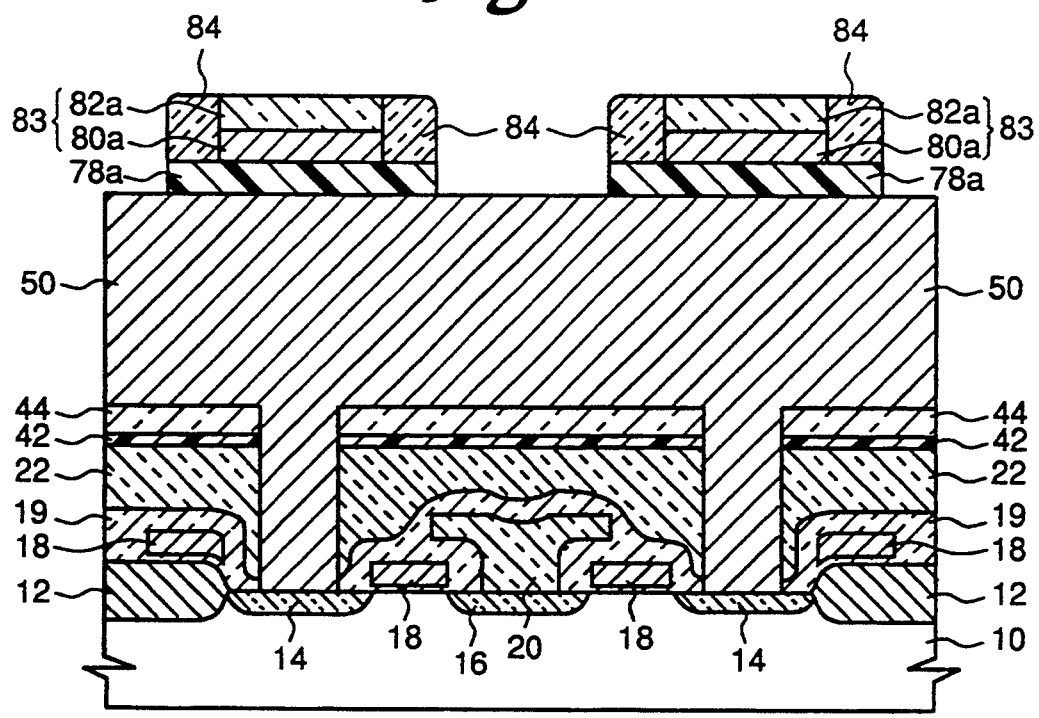

FIG. 18 illustrates a step of forming first spacer 84 and 1st first material layer pattern 78a. After the steps of FIG. 17, an oxide such as an HTO is coated to a thickness of about 1,000 Å on the whole surface of the resultant structure on which composite pattern 83 has been formed, thereby forming an oxide layer. The oxide layer thus obtained is anisotropically etched to form first spacer 84 on the sidewalls of the composite pattern. Then, first material later 78 is anisotropically etched, using composite pattern 83 and first spacer 84 as an etching mask, thereby forming first material layer pattern 78a.

Figure 19:
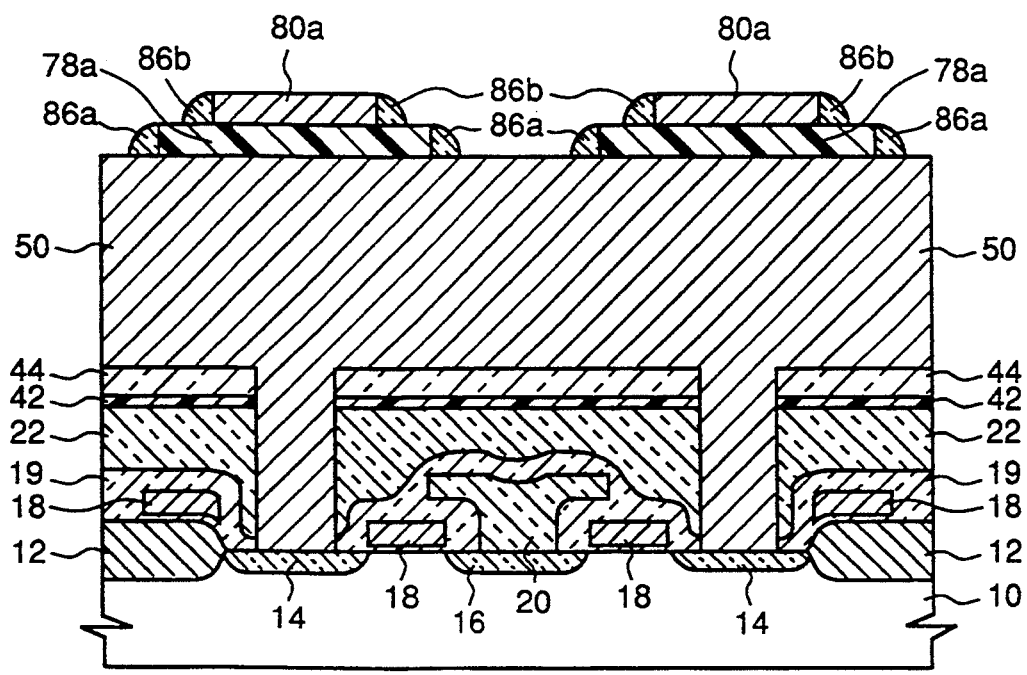

FIG. 19 illustrates a step of forming second spacers 86a and 86b for forming a double cylinder. After removing first spacer 84 and third material layer pattern 82a by a wet-etching using an etchant such as a BOE, an oxide such as an HTO is coated to a thickness of about 500 Å on the whole surface of the resultant structure, thereby forming an oxide layer. The oxide layer is then anisotropically etched, thereby forming a second spacer 86a for forming an outer cylinder on the sidewalls of second material layer pattern 78a and a second spacer 86b for forming inner cylinder on the sidewalls of second material layer pattern 80a.

Figure 20:
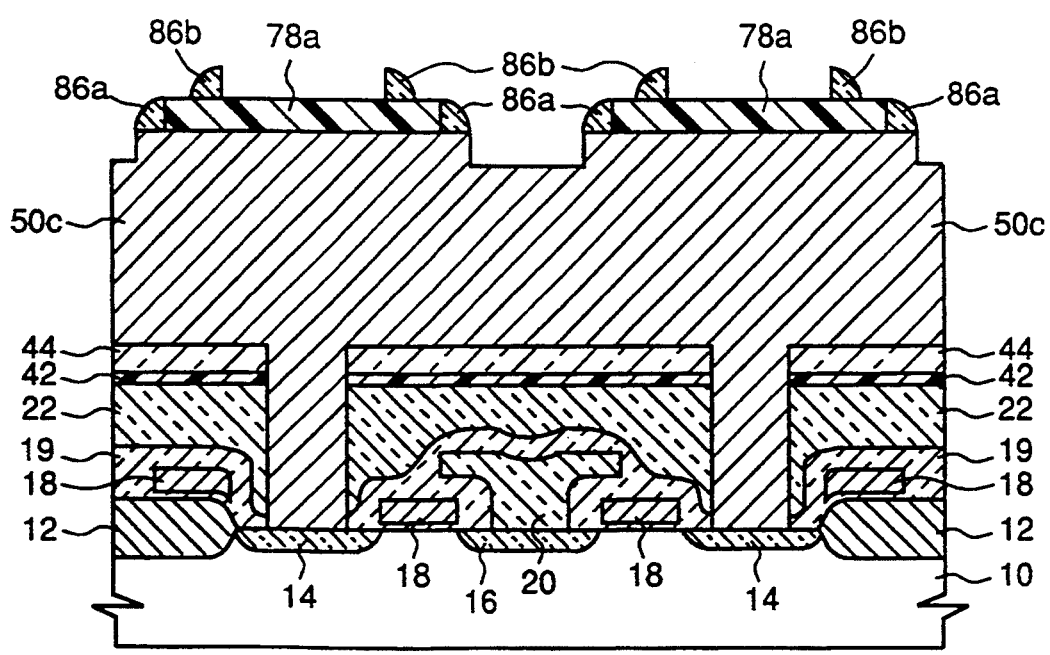

FIG. 20 illustrates a step of forming first conductive layer pattern 76c. After the step of FIG. 19, second material layer pattern 80a on the resultant is anisotropically etched until the surface of first material layer pattern 78a is exposed, thus removing second material layer pattern 80a. At this time, a portion (between second spacers 86a for forming an outer cylinder on first material layer pattern 78a) of first conductive layer 76, comprised of the same material layer as the second material layer pattern 80a, is simultaneously partially etched to a depth equal to the thickness of second material layer pattern 80a, to thereby form first conductive layer pattern 76a having a groove between the second spacers 86a. This step can be easily performed since the materials constituting second material layer pattern 80a and first conductive layer 76 are the same. Thus, first conductive layer pattern 76c having a groove between each cell unit is obtained.

Here, since the etched amount of first conductive layer 50 (the depth of the groove) can be determined by the thickness of second material layer pattern 80a, this step can be easily performed without encountering reproducibility problems with the time etching process.

Figure 21:
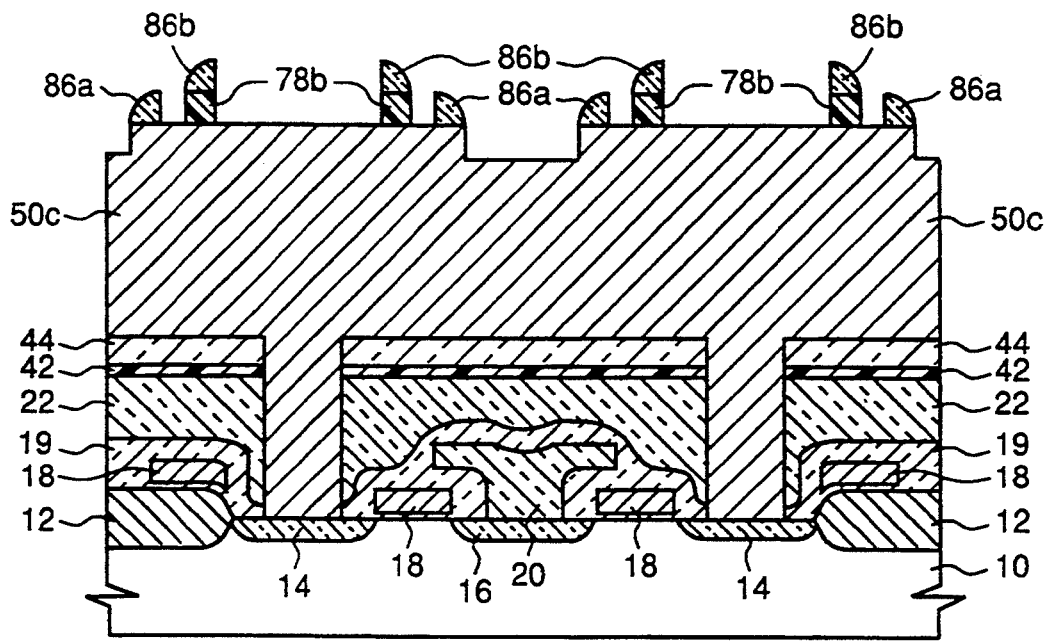

FIG. 21 illustrates the step of forming first material layer pattern 78b. After the step of FIG. 20, first material layer pattern 78a is anisotropically etched, using second spacers 86b as an etching mask to thereby form first material layer pattern 78b which is located below second spacer 86b and is comprised of the first material.

Figure 22:
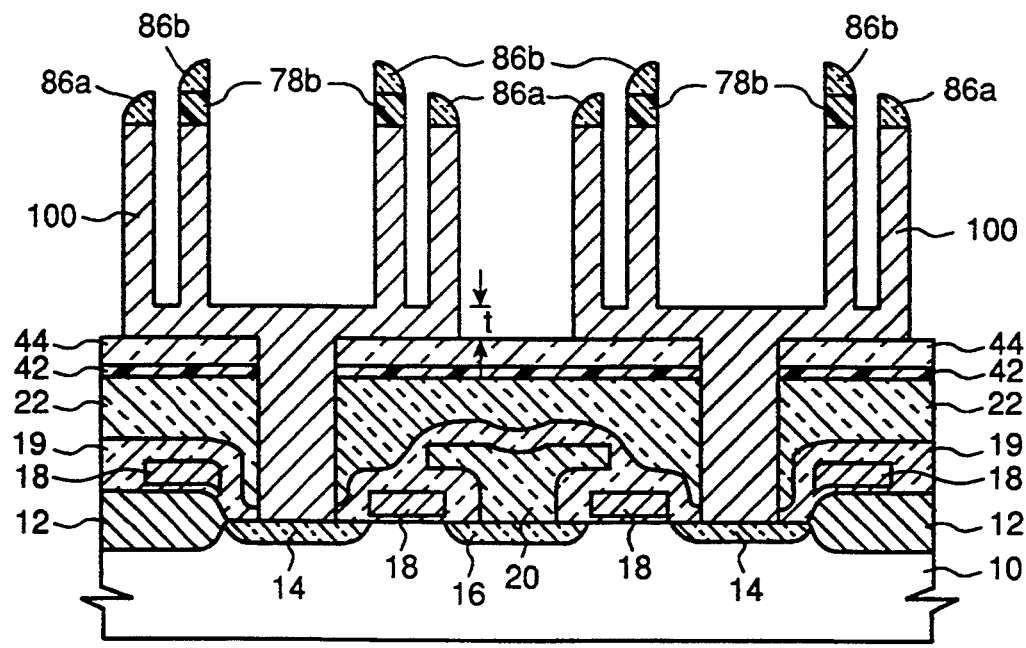

FIG. 22 illustrates a step of forming a double-cylindrical storage electrode 100. After the step of FIG. 21, an anisotropic etching is performed on the whole surface of the resultant structure, using second spacers 86a and 86b as an etching mask and first conductive layer pattern 76c as an etching object, until the surface of first insulating interlayer 44 is exposed, thereby forming double-cylindrical storage electrode 100. Here, it should be noted that the depth of the groove determines the thickness t of the lower supporting portion of the double cylinder.

Figure 23:
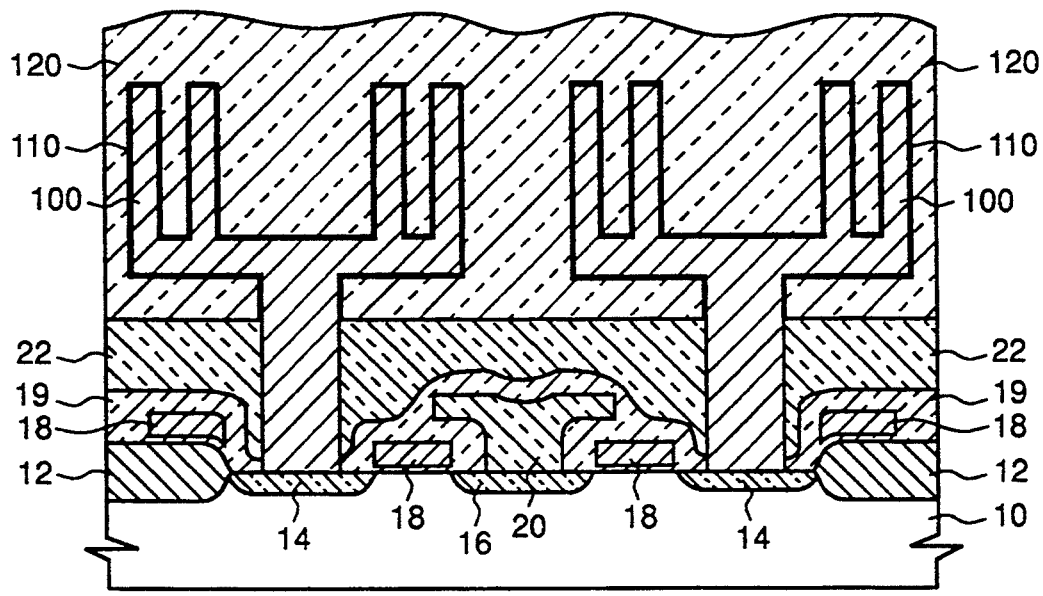

FIG. 23 illustrates a step of forming a dielectric film 110 and a plate electrode 120, thereby completing a capacitor. After removing second spacers 86a and 86b, first material layer pattern 78b, and first insulating interlayer 44, a dielectric film 110 and a plate electrode 120 are formed in the same manner as in Embodiment 1, thereby completing a capacitor comprised of storage electrode 100, dielectric film 110 and plate electrode 120.

In this embodiment, when forming a groove of first conductive layer 76, the depth of the groove is determined by the thickness of second material layer pattern 80a. Thus, the method of this embodiment can be easily reproduced.

Embodiment 5

FIGS. 24 to 30 are sectional views illustrating a fifth embodiment of the method for manufacturing a semiconductor memory device according to the present invention.

Figure 24:
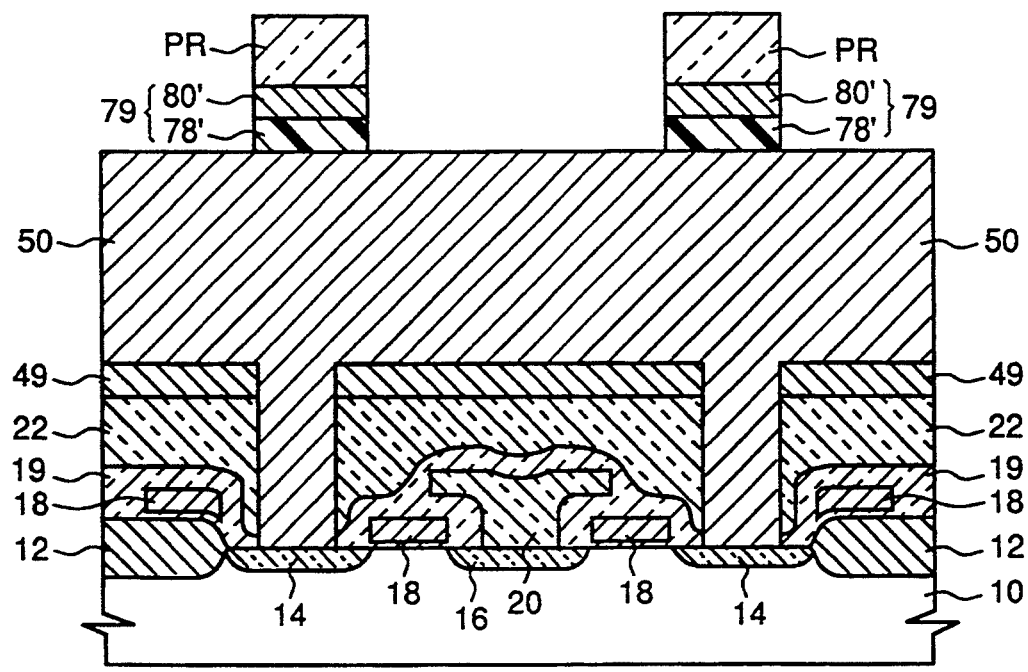
FIGS. 24 to 30 are sectional views for illustrating a fifth embodiment of a method for manufacturing a capacitor of a semiconductor memory device according to the present invention.

FIG. 24 illustrates a step of forming a first conductive layer 50 and a composite pattern 79. The procedure of Embodiment 1 is duplicated up to the point of forming first conductive layer 50 (FIG. 5), except that the formation of first, second and third insulating interlayer 44, 46 and 48 is omitted. After forming a contact hole connecting a storage electrode with a source region 14, a conductive material such as a polycrystalline silicon doped with an impurity is deposited to a thickness of about 4,000 Å–6,000 Å on the whole surface of the resultant, to thereby form a first conductive layer 50. Thereafter, a material whose etching rate is different from that of the material of the first conductive layer with respect to any etching, for example, an oxide (e.g., CVD oxide) or a nitride (e.g., a silicon nitride), is deposited to a thickness of about 500 Å–1,000 Å on the whole surface of the first conductive layer 50 to thereby form a first material layer. Then, a material whose etching rate is different from those of the materials constituting the first material layer and first conductive layer with respect to any etching, for example, a nitride (when the first material is an oxide) or an oxide (when the first material is a nitride) is deposited to a thickness of about 500 Å–1,000 Å to form a second material layer on the first material layer. On the second material layer, a photoresist is coated to form a photoresist film, which is patterned via a light-exposing and developing process, thereby forming a photoresist pattern PR to define the individual cell units. Using photoresist pattern PR as an etching mask, second and first material layers are etched, thereby forming a composite pattern 79 comprised of a first material pattern 78' and second material layer pattern 80'.

Optionally, a spacing layer 49 may be formed on planarization layer 22, prior to forming the contact hole. Spacing layer 49 is preferably formed by depositing a material having the same or a similar etching rate as that of the material constituting second material layer pattern 80' with respect to any etching, for example, a nitride or an oxide, to a thickness of about 500 Å–1,000 Å on planarization layer 22.

Figure 25:
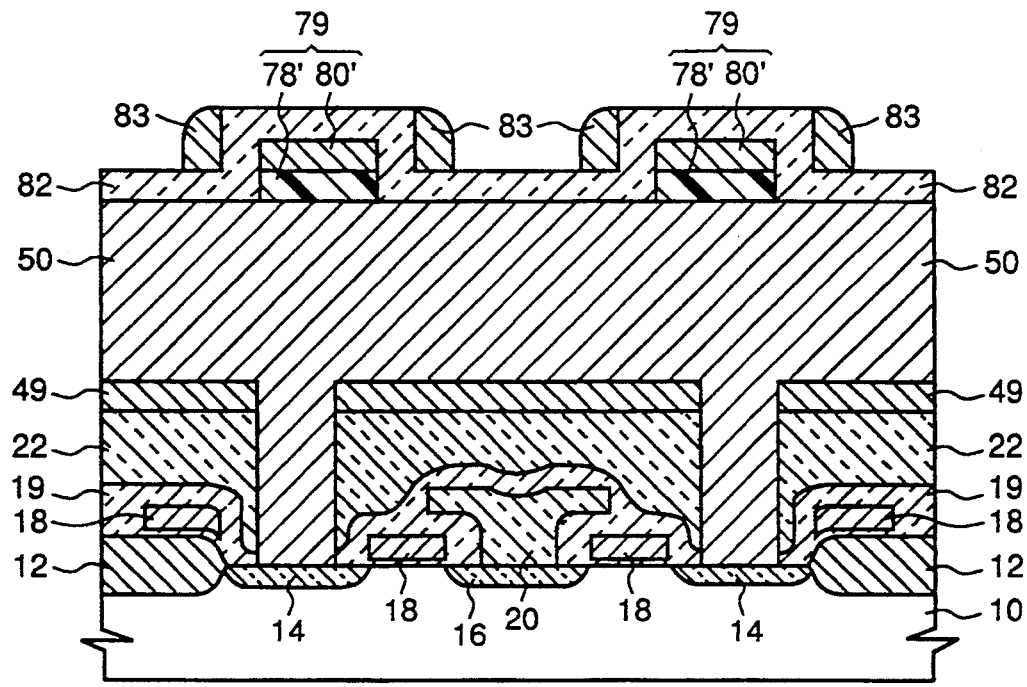

FIG. 25 illustrates a step of forming a third material layer 82 and a first spacer 83. After removing photoresist pattern PR, the same material as that constituting first material layer pattern 78' is deposited to a thickness of about 500 Å–1,000 Å on the whole surface of the structure on which composite pattern 79 has been formed, to thereby form third material layer 82 covering composite pattern 79 and having a recessed portion between the composite patterns. Thereafter, the same material as that constituting second material layer pattern 80' is coated to a thickness of about 500 Å on the third material layer, to thereby form a fourth material layer, which is anisotropically etched, thereby forming first spacer 83 on the sidewalls of the recessed portion of third material layer 82 so that third material layer 82 is interposed between composite pattern 79 and first spacer 83.

Figure 26:
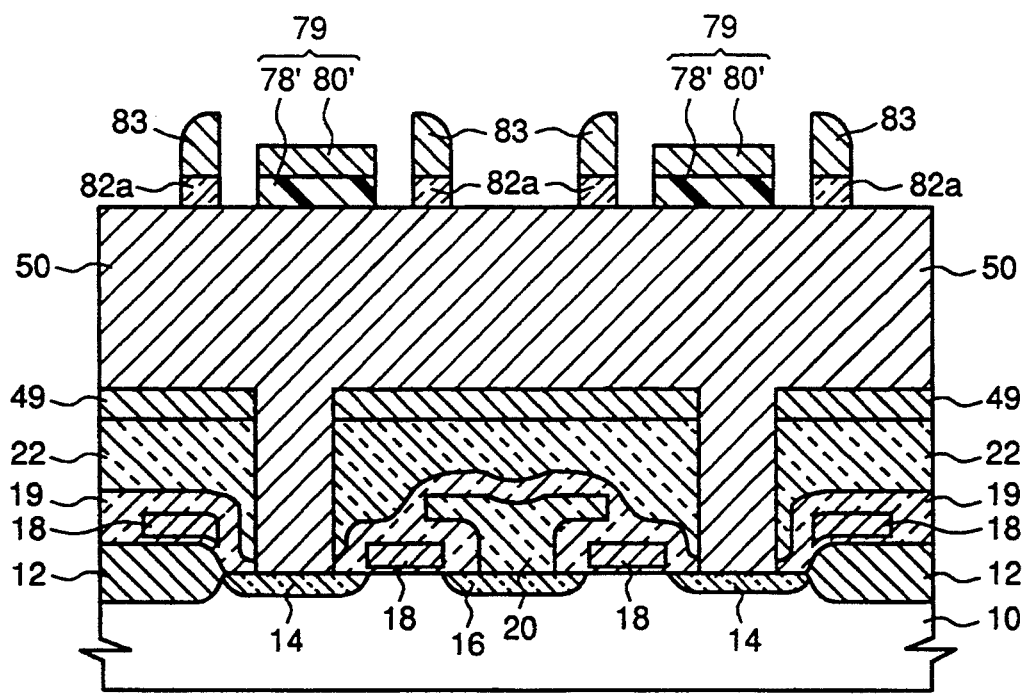

FIG. 26 illustrates a step of forming a third material layer pattern 82a. After the step of FIG. 25, third material layer 82 is anisotropically etched, using first spacer 83 as an etching mask, until the surface of first conductive layer 50 is exposed. Thus, third material layer pattern 82a is formed beneath first spacer 83.

At this point, since the material of second material layer pattern 80' has a different etching rate from that of the material of third material layer 82 with respect to anisotropic etching, second material layer 80' can protect first material layer 78' from being anisotropically etched. Further, it should be noted that third material layer pattern 82a is formed into a cylindrical shape completely surrounding, and located at a predetermined distance from, first material layer pattern 78'. The distance is determined by the thickness of third material layer 82.

Figure 27:
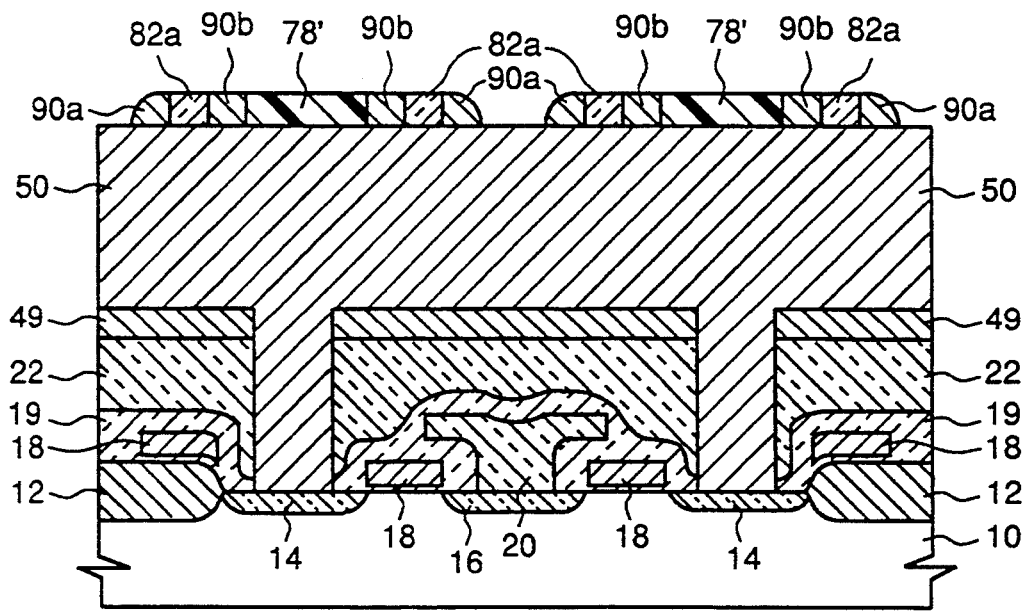

FIG. 27 illustrates a step of forming a fourth material layer spacer 90a as an outer etching mask for forming an outer cylinder and fourth material spacer 90b as an inner etching mask for forming an inner cylinder. After removing first spacer 83 and second material layer pattern 80', a material whose etching rate is different from those of the materials constituting first conductive layer 50 and first material layer pattern 78' with respect to any etching, e.g., the same material as that of the second material layer pattern 80' (i.e., a nitride or an oxide), is deposited on the whole surface of the resultant structure to thereby form a fourth material layer 90 (not shown), which is subsequently etched back until first material layer pattern 78' and third material layer pattern 82a are exposed, thereby forming a fourth material layer spacer 90a as an outer etching mask on the outer sidewall of third material layer pattern 82a and fourth material pattern 90b as an inner etching mask in the space between first material layer pattern 78' and third material layer pattern 82a.

Figure 28:
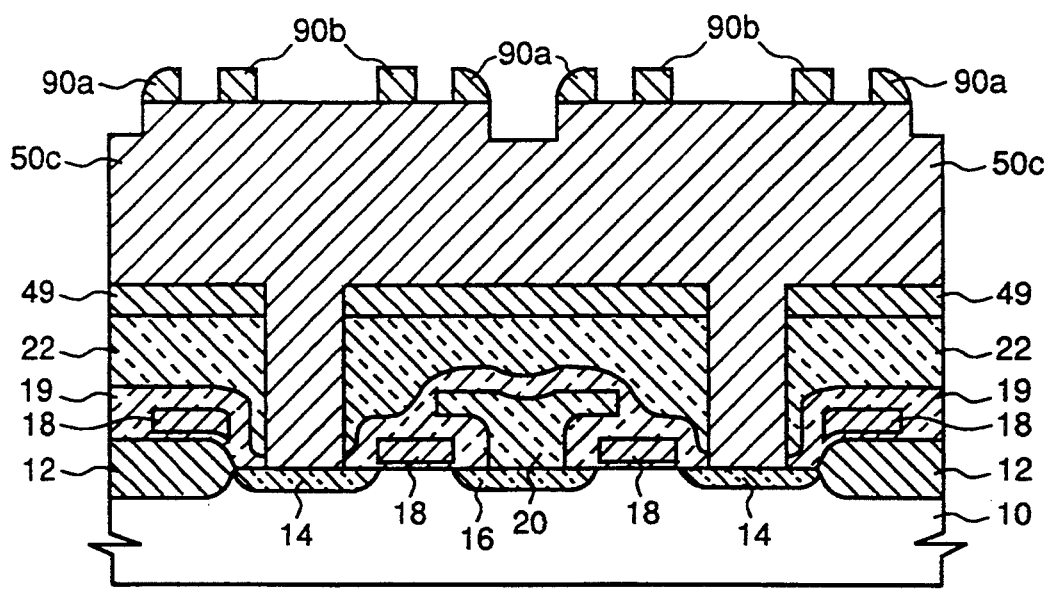

FIG. 28 illustrates a step of forming a first conductive layer pattern 50c having fourth material spacer 90a as an outer etching mask for forming an outer cylinder and fourth material pattern 90b for forming an inner cylinder. First conductive layer 50 is anisotropically etched to a depth of about 500Å Å–1,000 Å, using first material layer pattern 78', third material layer pattern 82a, and fourth material spacer pattern 90a and 90b as etching masks, to form first conductive pattern 50c having a groove between the outer etching masks. Then first material layer pattern 78' and third material layer pattern 82a are removed by wet-etching using an oxide etchant solution such as BOE or a nitride etchant solution such as phosphoric acid.

Figure 29:
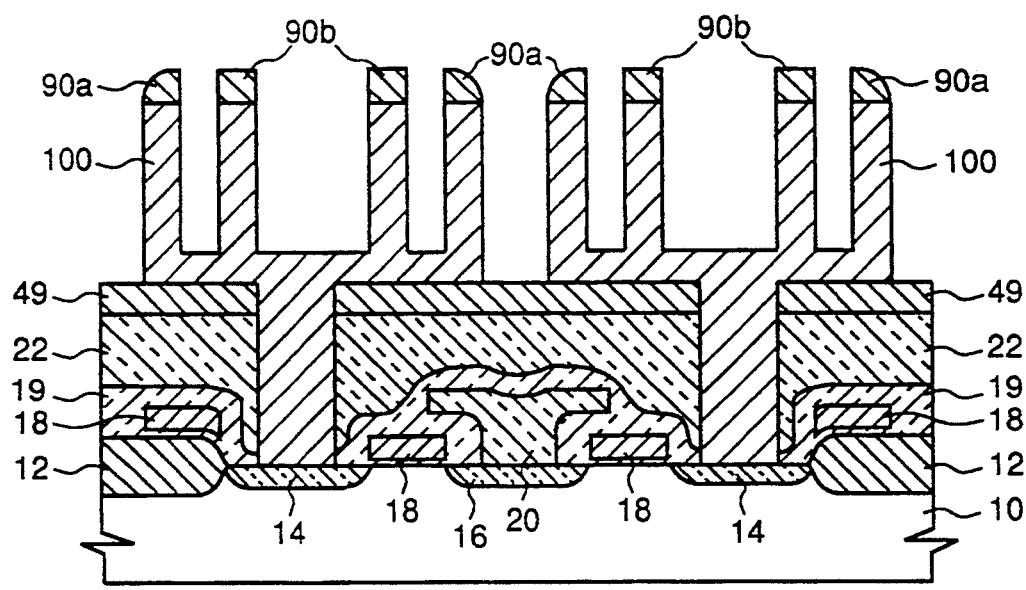

FIG. 29 illustrates a step of forming a storage electrode 100. After the step of FIG. 28, first conductive layer pattern 50c is anisotropically etched by using fourth material spacer pattern 90a and 90b as an etching mask, until the surface of the spacing layer 49 formed beneath first conductive layer patten 50c is exposed, thereby forming a double-cylindrical storage electrode 100 divided into individual cell units.

Figure 30:
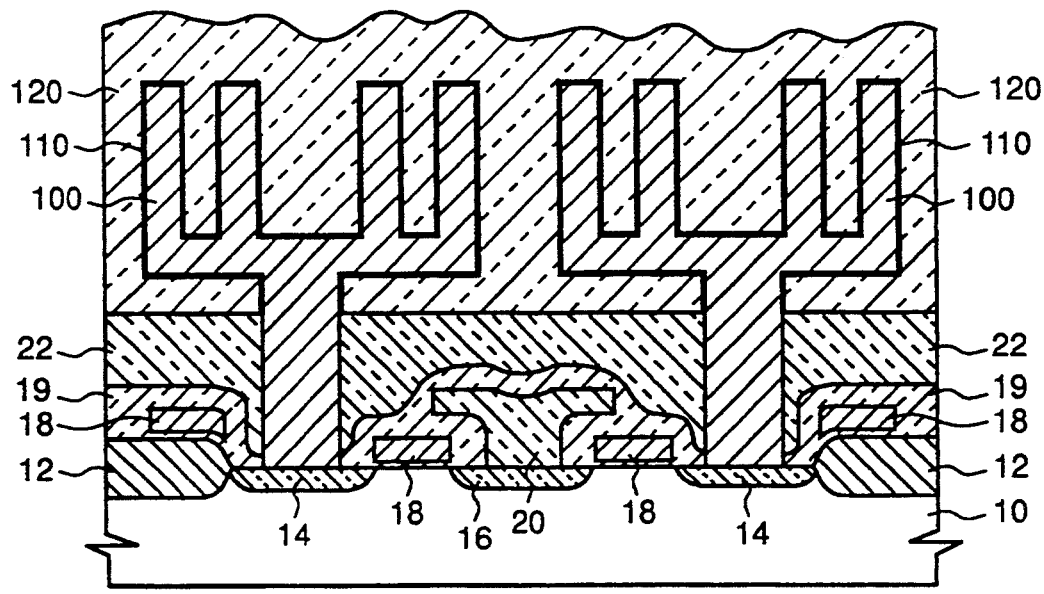

FIG. 30 illustrates a step of forming a dielectric film 110 and a plate electrode 120, thereby completing a capacitor. After removing fourth material spacer pattern 90a and 90b and spacing layer 49, a dielectric film 110 and a plate electrode 120 are formed in the same manner as in Embodiment 1, thereby completing a capacitor comprised of storage electrode 100, dielectric film 110 and plate electrode 120.

Here, the surface region where the spacing layer on the planarization layer is removed, can be used for the effective cell capacitance region in order to increase the cell capacitance.

Embodiment 6

FIGS. 31 to 35 are sectional views illustrating a sixth embodiment of a method for manufacturing a semiconductor memory device according to the present invention. This embodiment shows a method for manufacturing a capacitor by using a second etching stop layer formed on the first conductive layer of Embodiment 5. Except for the formation of a second etching stop layer, the steps are similar to those of Embodiment 5.

Figure 31:
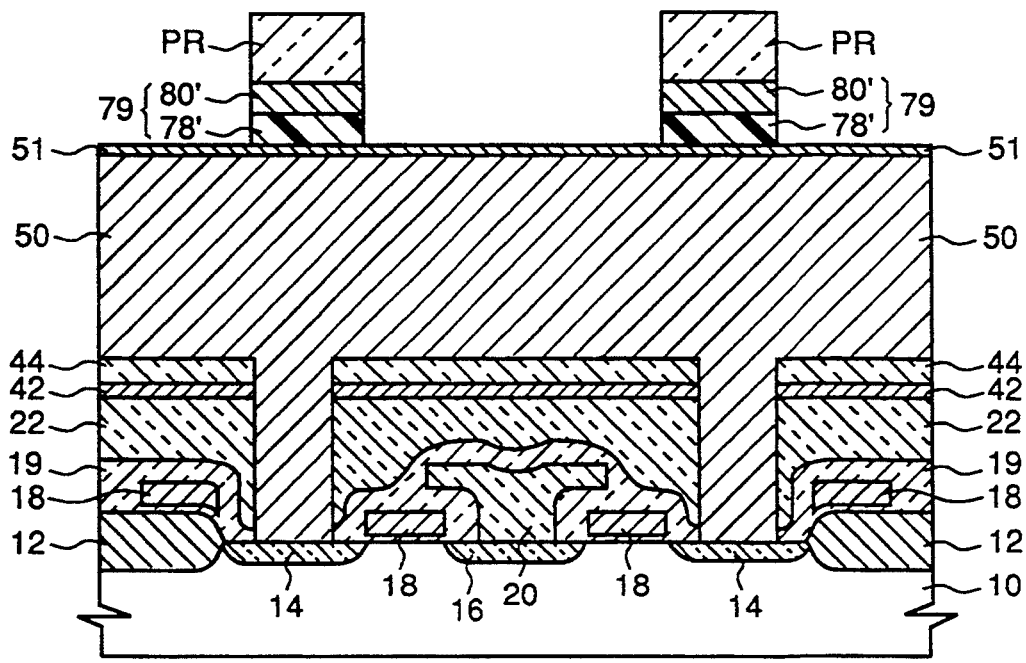
FIGS. 31 to 35 are sectional views for illustrating a sixth embodiment of a method for manufacturing a capacitor of a semiconductor memory device according to the present invention.

FIG. 31 illustrates a step of forming a first conductive layer 50, a second etching stop layer 51, and a composite pattern 79. The procedure of Embodiment 1 is duplicated up to the point of forming first conductive layer 50 (FIG. 5), except that the formation of second and third insulating interlayer 46 and 48 is omitted. On a first conductive layer 50, a second etching stop layer 51 is formed to a thickness of about 20 Å–30 Å. As a second etching stop layer 51 used in this embodiment, a native oxide layer is preferably allowed to form naturally when first conductive layer 50 is left exposed. However, an oxide layer or a nitride layer which can be formed as thinly as the native oxide layer by any conventional process, can replace the native oxide layer.

Thereafter, composite pattern 79 is formed on native oxide layer 51 in the same manner as in Embodiment 5. However, the material constituting first material layer pattern 78' in this embodiment is different from the material constituting first material layer pattern of Embodiment 5. More particularly, a material having the same etching rate as that of the material constituting first conductive layer 50 with respect to any etching, for example, an impurity-doped polycrystalline silicon, can be used for first material layer pattern 78'.

Further, for forming a first etching stop layer 42 on planarization layer 22, a material having the same or a similar etching rate as that of the material constituting a second material layer pattern 80' with respect to any etching, is deposited to a thickness of about 70 Å–500 Å on planarization layer 22. Thereafter, a material having a different etching rate from that of the material constituting the second material layer 80' with respect to any etching, is deposited to a thickness of about 70 Å–1,000 Å on first etching stop layer 42, thereby forming first insulating interlayer 44.

Figure 32:
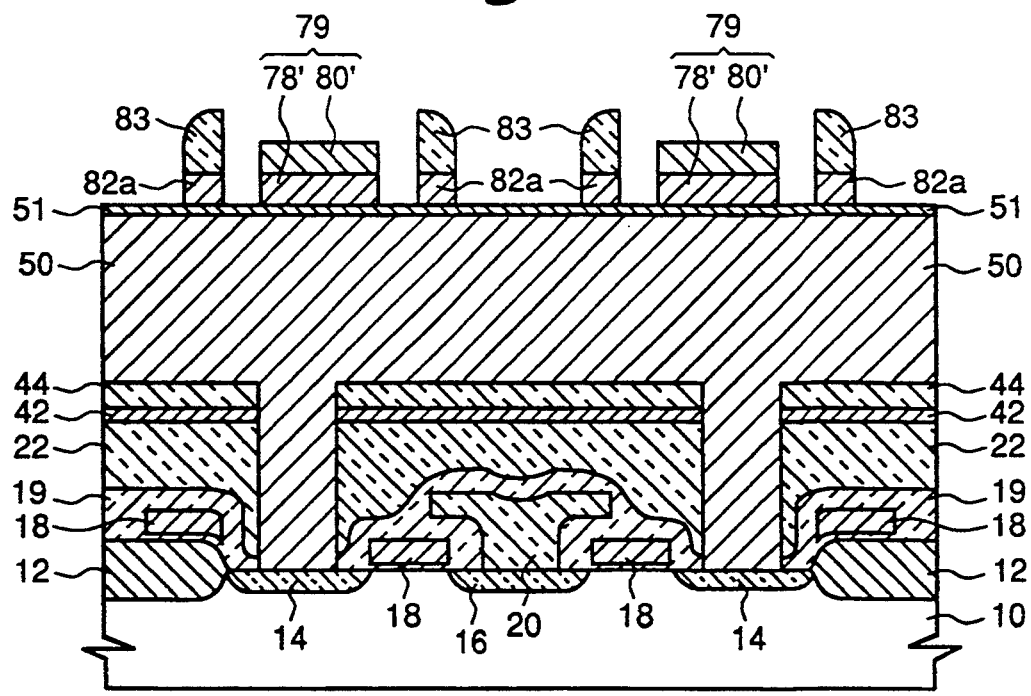

FIG. 32 illustrates a step of forming a first spacer 83 and a third material layer pattern 82a. This step is performed in the same manner as described in FIGS. 25 and 26 of Embodiment 5 using second etching stop layer 51 obtained as above, except that a material having the same etching rate as that of the material constituting first material pattern 78' with respect to any etching, for example, a polycrystalline silicon, is used for third material layer pattern 82a.

Figure 33:
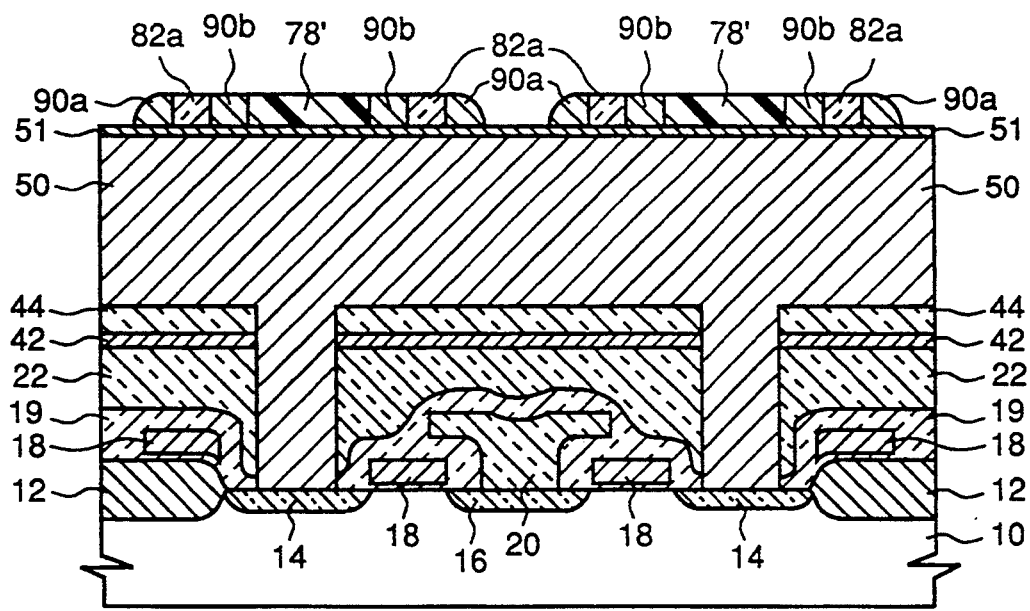

FIG. 33 illustrates a step of forming a fourth material layer spacer 90a as an outer etching mask for forming an outer cylinder and fourth material spacer 90b as an inner etching mask for forming an inner cylinder. After removing first spacer 83 and second material layer pattern 80', a fourth material such as a nitride is coated on the resultant, to thereby form a fourth material layer, which is then anisotropically etched until the surface of first material layer pattern 78' and third material layer pattern 82a is exposed, to form a fourth material layer spacer 90a as an outer etching mask for forming an outer cylinder and fourth material spacer 90b as an inner etching mask for forming an inner cylinder. When an oxide layer or a nitride layer as a second etching stop layer is formed instead of the native oxide layer, the oxide or nitride may be coated as the fourth material layer on the resultant structure having first material layer pattern 78' and third material layer pattern 82a formed thereon.

Figure 34:
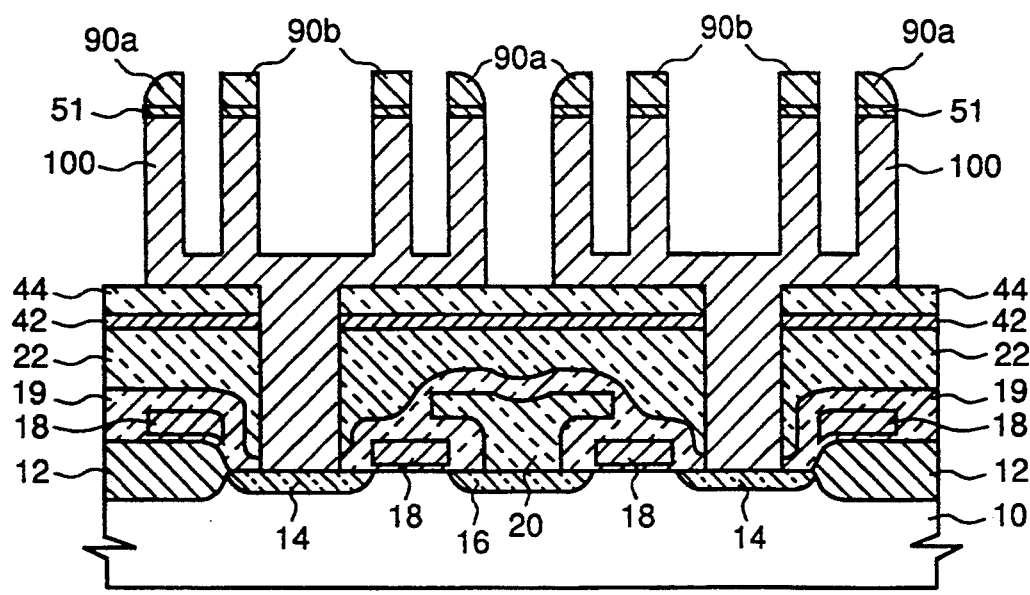

FIG. 34 illustrates a step of forming a storage electrode 100. After the step of FIG. 33, using first material layer pattern 78', third material layer pattern 82a, fourth material spacer pattern 90a and 90b as an etching mask, a portion of second etching stop layer 51 between fourth material layer spacers 90a is selectively removed to thereby expose a surface portion of first conductive layer 50 between fourth material layer spacer 90a. Thereafter, first material layer pattern 78', third material layer 82a and the exposed portion of first conductive layer 50 between fourth material layer spacer 90a are removed, to thereby form a first conductive layer pattern having a groove between fourth material layer spacers 90a, 90a (having a similar shape as that of first conductive layer 50a in FIG. 28). Then, after removing first material layer pattern 78' and third material layer 82a, an exposed portion of second etching stop layer 51 and first conductive layer 50 are anisotropically etched until the surface of first insulating interlayer 44 is exposed.

Figure 35:
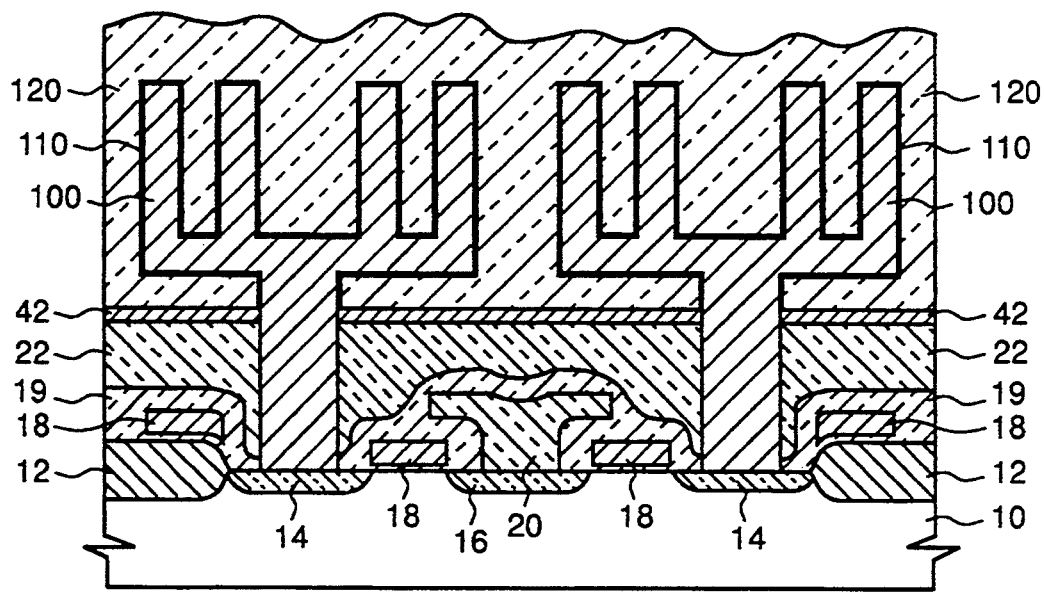

FIG. 35 illustrates a step of forming a dielectric film 110 and a plate electrode 120, thereby completing a capacitor. After removing fourth material spacer pattern 90a and 90b and first insulating interlayer 44, a dielectric film 110 and a plate electrode 120 are formed in the same manner as in Embodiment 1, thereby completing a capacitor comprised of storage electrode 100, dielectric film 110 and plate electrode 120.

According to the present embodiment (Embodiment 6), a storage electrode having equal-height double cylinders, can be manufactured by using a second etching stop layer formed on the first conductive layer.

According to the present invention, a storage electrode of a capacitor can be obtained from a single conductive layer. This circumvents the influence of a native oxide layer. The storage electrode is formed from one conductive layer so the electrode cannot be easily broken, while ensuring large cell capacitance by obtaining inner and outer cylinders of equal height. Also, the thus-formed storage electrode is not susceptible to fracturing from the weak bonding force between elements, as is the case when the storage electrode is the result of separately formed layers.

Since the storage electrode of the present invention has no sharp edges, leakage current can be minimized or avoided. Additionally, since a conductive layer is etched directly to form the storage electrode, using an etching mask, the formation of slanted storage electrodes is avoided. Therefore, void formation can be avoided, which enhances the reliability of a semiconductor memory device using the present invention.

Moreover, the lower surface of the storage electrode can also be utilized as an effective cell capacitance region, which further increases cell capacitance for high integration.

Further, a storage electrode having an auxiliary fin-structured electrode beneath the main double-cylindrical electrode portion, can be formed. This also increases cell capacitance.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method of manufacturing a semiconductor memory device, which comprises the steps of:
   (a) forming a conductive layer on a semiconductor substrate;
   (b) forming a first material mask pattern defining individual cell units on said conductive layer;
   (c) sequentially forming a first spacer on a sidewall of said first material mask pattern within each individual cell unit and a second spacer on a sidewall of said first spacer;
   (d) anisotropically etching said conductive layer using first material mask pattern and said first and second spacers as an etching mask, thereby forming a plurality of conductive patterns defining individual cell units;
   (e) removing said first material mask pattern and said second spacer;
   (f) partially etching an upper portion of each said conductive pattern using said first spacer as an etching mask, thereby forming an upwardly extending portion within each said conductive pattern;
   (g) forming third and fourth noncontiguous spacers adjacent each of said upwardly extending portions; and
   (h) anisotropically etching each of said conductive patterns having said upwardly extending portions, said third spacer and said fourth spacer being used as an etch mask.

2. A method of manufacturing a capacitor electrode of a semiconductor device comprising the steps of:
   (a) forming a conductive layer on a semiconductor substrate;
   (b) forming a first material mask pattern on said conductive layer for defining individual cell units;
   (c) sequentially forming a first spacer on a sidewall of said first material mask pattern then forming a second spacer on a sidewall of said first spacer;
   (d) anisotropically etching said conductive layer using said first material mask pattern and said first and second spacers as etching masks, thereby forming a first conductive pattern defined into individual cell units;
   (e) removing said first material mask pattern and said second spacer;
   (f) forming an inner spacer on an inner sidewall of said first spacer and an outer spacer on an outer sidewall of said first spacer; and
   (g) anisotropically partially etching said individual cell units of said first conductive pattern using said inner spacer and said outer spacer as said inner and outer etching masks, respectively, to obtain a first electrode of a semiconductor device.

3. A method of manufacturing a capacitor of a semiconductor device comprising the steps of:
   (a) forming a conductive layer on a semiconductor substrate;
   (b) forming a first material layer on said conductive layer;
   (c) forming a plurality of composite patterns on said first material layer, each said composite pattern being comprised of a third material layer stacked atop a second material layer, each said composite pattern defining an individual, spatially separated, cell unit;
   (d) forming a plurality of first spacers, each of which peripherally surrounds each of said composite mask patterns;
   (e) anisotropically etching said first material layer using said first spacers and said third material layers of said composite mask patterns as etching masks to form a first material pattern;
   (f) removing said first spacers and said third material layers from each said composite mask pattern;
   (g) forming a plurality of second spacers, each second spacer concentrically surrounding one of said first material patterns and spatially separated from adjacent second spacers, thereby leaving exposed a portion of said conductive layer between adjacent second spacers, and a plurality of third spacers, each third spacer concentrically surrounding one of said second material layers and leaving exposed an outer portion of said first material pattern;
   (h) simultaneously etching back each of said second material layers and etching said conductive layer to thereby provide a conductive pattern with a groove; and
   (i) anisotropically etching said first material pattern and an upper portion of each of said conductive patterns using said second and third spacers as etching masks, thereby resulting in a double-walled electrode of a capacitor.

4. A method of manufacturing a semiconductor memory device comprising the steps of:
- (a) forming a conductive layer on a semiconductor substrate;
- (b) forming a plurality of composite mask patterns on said conductive layer, each said composite mask pattern being comprised of a second material layer stacked on a first material layer, thereby defining a plurality of spatially separated individual cell units;
- (c) forming a third material layer over the entire structure obtained after step (b), said third material layer having a recessed portion between adjacent composite mask patterns;
- (d) forming a plurality of first spacers, each first spacer formed on a sidewall of said recessed portion of said third material layer and thus concentrically surrounding one of said composite mask patterns;
- (e) anisotropically etching said third material layer using each of said first spacers as an etching mask to thereby form a third material mask pattern and exposing each of said composite mask patterns;
- (f) removing said first spacers and each of said second material mask patterns;
- (g) forming a plurality of second spacers concentrically surrounding an outer sidewall of each of said third material mask patterns and a plurality of fourth material mask patterns between each of said third material mask patterns and said first material mask patterns;
- (h) etching an upper portion of each of said conductive layers using said second spacers, said fourth material mask patterns, said third material mask patterns, and said first material mask layers as etching masks to form a conductive pattern with a groove;
- (i) removing said first material mask layers and said third material mask patterns; and
- (j) anisotropically etching said conductive pattern using said second spacers and said fourth material mask patterns as outer and inner etch masks, respectively.

* * * * *